(12) United States Patent
Lo et al.

(10) Patent No.: US 12,107,160 B2
(45) Date of Patent: Oct. 1, 2024

(54) POWER DEVICE AND MANUFACTURING METHOD THEREOF

(71) Applicant: Richtek Technology Corporation, Zhubei (TW)

(72) Inventors: Kuo-Hsuan Lo, Taoyuan (TW); Chien-Hao Huang, Penghu (TW); Chu-Feng Chen, Hsibchu (TW); Wu-Te Weng, Hsibchu (TW); Chien-Wei Chiu, Yunlin (TW)

(73) Assignee: RICHTEK TECHNOLOGY CORPORATION, Zhubei (TW)

(*) Notice: Subject to any disclaimer, the term of this patent is extended or adjusted under 35 U.S.C. 154(b) by 426 days.

(21) Appl. No.: 17/726,515

(22) Filed: Apr. 21, 2022

(65) Prior Publication Data
US 2022/0376110 A1 Nov. 24, 2022

(30) Foreign Application Priority Data
May 19, 2021 (TW) ................. 110118045

(51) Int. Cl.
| | |
|---|---|
| H01L 29/78 | (2006.01) |
| H01L 21/265 | (2006.01) |
| H01L 21/266 | (2006.01) |
| H01L 21/761 | (2006.01) |
| H01L 21/762 | (2006.01) |
| H01L 29/06 | (2006.01) |
| H01L 29/10 | (2006.01) |
| H01L 29/66 | (2006.01) |

(52) U.S. Cl.
CPC .... *H01L 29/7816* (2013.01); *H01L 21/26513* (2013.01); *H01L 21/266* (2013.01); *H01L 21/761* (2013.01); *H01L 21/76202* (2013.01); *H01L 29/063* (2013.01); *H01L 29/0653* (2013.01); *H01L 29/1095* (2013.01); *H01L 29/66681* (2013.01)

(58) Field of Classification Search
None
See application file for complete search history.

(56) References Cited

U.S. PATENT DOCUMENTS

| | | | |
|---|---|---|---|
| 7,405,443 B1 * | 7/2008 | Zuniga | H01L 29/402 257/E29.264 |
| 2006/0113625 A1 * | 6/2006 | Bude | H01L 29/7835 257/493 |
| 2013/0093010 A1 | 4/2013 | Huang et al. | |
| 2013/0134512 A1 | 5/2013 | Cheng et al. | |
| 2013/0187226 A1 | 7/2013 | Park | |

(Continued)

*Primary Examiner* — Asok K Sarkar
(74) *Attorney, Agent, or Firm* — Tung & Associates

(57) ABSTRACT

A power device includes: a semiconductor layer, a well region, a body region, a gate, a sub-gate, a source, a drain, and an electric field adjustment region. The sub-gate is formed above a top surface of the semiconductor layer, wherein a portion of the well region is located vertically beneath the sub-gate. The sub-gate is not directly connected to the gate. The electric field adjustment region has a conductivity type which is opposite to that of the well region. The electric field adjustment region is formed beneath and not in contact with the top surface of the semiconductor layer. The electric field adjustment region is located in the well region of the semiconductor layer, and at least a portion of the electric field adjustment region is located vertically beneath the sub-gate.

18 Claims, 16 Drawing Sheets

(56) References Cited

U.S. PATENT DOCUMENTS

2013/0292763 A1* 11/2013 Chang ................ H01L 29/7816
 257/335
2018/0145139 A1   5/2018 Kantarovsky et al.

* cited by examiner

POWER DEVICE AND MANUFACTURING METHOD THEREOF

CROSS REFERENCE

The present invention claims priority to TW 110118045 filed on May 19, 2021.

BACKGROUND OF THE INVENTION

Field of Invention

The present invention relates to a power device and a manufacturing method thereof, and particularly to a power device and a manufacturing method thereof which can enhance breakdown voltage and decrease conduction resistance.

Description of Related Art

FIGS. 1A and 1B show a top view and a cross-sectional view, respectively, of a conventional power device 100. FIG. 1B shows a cross-sectional view taken along a cross-section line AA' in FIG. 1A. A power device, in the context of this invention, refers to a semiconductor device operating to transmit power, whose drain, when implemented by a metal-oxide-semiconductor field effect transistor (MOSFET), is typically required to receive a voltage which is higher than 5V during normal operation. In general, the drain 19 and the body region 16 of the power device are separated by a drift region 12a in between (as indicated by the dashed line in FIG. 1B), and the lateral length of the drift region 12a is determined according to the voltage that the power device 100 requires to withstand in normal operation. As shown in FIGS. 1A and 1B, the power device 100 includes a well region 12, an isolation structure 13, a drift oxide region 14, a body region 16, a gate 17, a source 18, and a drain 19. The well region 12 which is N-type is formed on the substrate 11, and the isolation structure 13 is a local oxidation of silicon (LOCOS) structure for defining an operation region 13a as an active region when the power device 100 operates. The range of the operation region 13a is indicated by the thick black dashed line in FIG. 1A. As shown in FIG. 1A, a portion of the gate 17 which is above the drift region 12a covers a part of the drift oxide region 14. There is a dilemma in designing the thicknesses of the isolation structure 13 and the drift oxide region 14. In order to reduce the conduction resistance of the power device 100, the thicknesses of the isolation structure 13 and the drift oxide region 14 should be decreased; however, the breakdown voltage of the power device 100 will correspondingly be lowered, whereby the applicable range of the power device 100 will be limited. In order to enhance the withstand voltage of the power device 100, the thicknesses of the isolation structure 13 and the drift oxide region 14 should be increased; however, the conduction resistance of the power device 100 will therefore be increased, to undesirably lower the operation speed and the performance of the device.

In view of the above, the present invention proposes a power device and a manufacturing method thereof which can enhance the breakdown voltage during OFF operation of the device and reduce the conduction resistance.

SUMMARY OF THE INVENTION

In one aspect, the present invention provides a power device, including: a semiconductor layer formed on a substrate, wherein the semiconductor layer has a top surface; a well region having a first conductivity type, wherein the well region is formed in the semiconductor layer and is located beneath the top surface and in contact with the top surface; a body region having a second conductivity type, wherein the body region is formed in the semiconductor layer and is located beneath the top surface and in contact with the top surface, wherein the body region is adjacent to the well region in a channel direction; a gate formed on the top substrate, wherein a portion of the body region is located vertically beneath the gate and in contact with the gate, to provide an inverse current channel of the power device during ON operation of the power device, and a portion of the well region is located vertically beneath the gate, to provide a drift current channel of the power device during the ON operation of the power device; a sub-gate formed above the top surface, wherein a portion of the well region is located vertically beneath the sub-gate, and wherein the sub-gate and the gate are not directly connected with each other; a source and a drain having the first conductivity type, wherein the source and the drain are formed beneath the top surface and in contact with the top surface, wherein the source is located in the body region under and outside of the gate, and the drain is located in the well region and away from the body region, wherein from a top view, the sub-gate is located between the gate and the drain; and an electric field adjustment region having the second conductivity type, wherein the electric field adjustment region is formed beneath the top surface and is not in contact with the top surface, wherein the electric field adjustment region is located in the well region in the semiconductor layer, and the electric field adjustment region is formed between the body region and the drain.

In another aspect, the present invention provides a manufacturing method of a power device, including: forming a semiconductor layer on a substrate, wherein the semiconductor layer has a top surface; forming a well region in the semiconductor layer, wherein the well region has a first conductivity type, and the well region is located beneath the top surface and in contact with the top surface; forming a body region in the semiconductor layer, wherein the body region has a second conductivity type and the body region is located beneath the top surface and in contact with the top surface, wherein the body region is adjacent to the well region in a channel direction; forming an electric field adjustment region beneath the top surface, wherein the electric field adjustment region is not in contact with the top surface, and the electric field adjustment region has the second conductivity type, wherein the electric field adjustment region is located in the well region in the semiconductor layer; forming a gate on the top substrate, wherein a portion of the body region is located vertically beneath the gate and in contact with the gate, to provide an inverse current channel of the power device during ON operation of the power device, and a portion of the well region is located vertically beneath the gate, to provide a drift current channel of the power device during the ON operation of the power device; forming a sub-gate above the top surface, wherein a portion of the well region is located vertically beneath the sub-gate, and the sub-gate and the gate are not directly connected with each other; and forming a source and a drain beneath the top surface, wherein the source and the drain are in contact with the top surface, and the source and the drain have the first conductivity type, wherein the source is located in the body region under and outside of the gate, and the drain is located in the well region and away from the body region, wherein from a top view, the sub-gate is located between the gate and the drain; wherein the electric field adjustment region is formed between the body region and the drain.

In one embodiment, the power device further includes a resistance adjustment region having the first conductivity type, wherein the resistance adjustment region is formed beneath the top surface and in contact with the top surface, wherein the resistance adjustment region is located above the electric field adjustment region in the well region in the semiconductor layer, and the resistance adjustment region is formed between the body region and the drain.

In one embodiment, the electric field adjustment region is in contact with a bottom of the resistance adjustment region.

In one embodiment, the resistance adjustment region and the electric field adjustment region are defined by a same lithography process step.

In one embodiment, the sub-gate is electrically floating or electrically connected to the source.

In one embodiment, the power device further includes: a first deep well region having the second conductivity type, wherein the first deep well region is formed beneath the well region and the body region in the semiconductor layer, and in the semiconductor layer, the first deep well region is completely in contact with and covers bottoms of the well region and the body region; and a second deep well region having the first conductivity type, wherein the second deep well region is formed beneath the first deep well region in the semiconductor layer, and in the semiconductor layer, the second deep well region is completely in contact with and covers a bottom of the first deep well region.

In one embodiment, the power device further includes: a drift oxide region formed above the top surface, and under and in contact with the sub-gate, wherein at least a portion of the resistance adjustment region and the electric field adjustment region is located vertically beneath the drift oxide region.

In one embodiment, the resistance adjustment region and the electric field adjustment region are completely not located vertically beneath the gate.

In one embodiment, the resistance adjustment region and the electric field adjustment region are defined by the sub-gate.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, but the shapes, thicknesses, and widths are not drawn in actual scale.

Figure 1A:
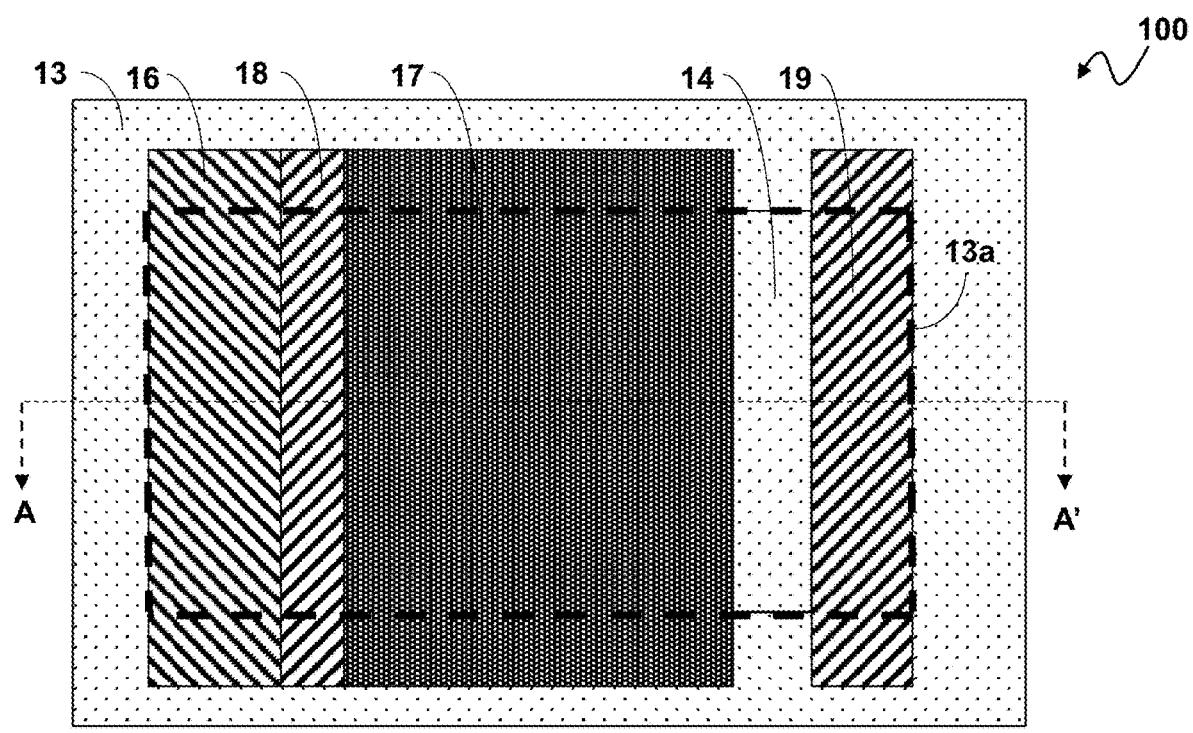
FIGS. 1A and 1B show a top view and a cross-sectional view, respectively, of a conventional power device 100.
Figure 1B:
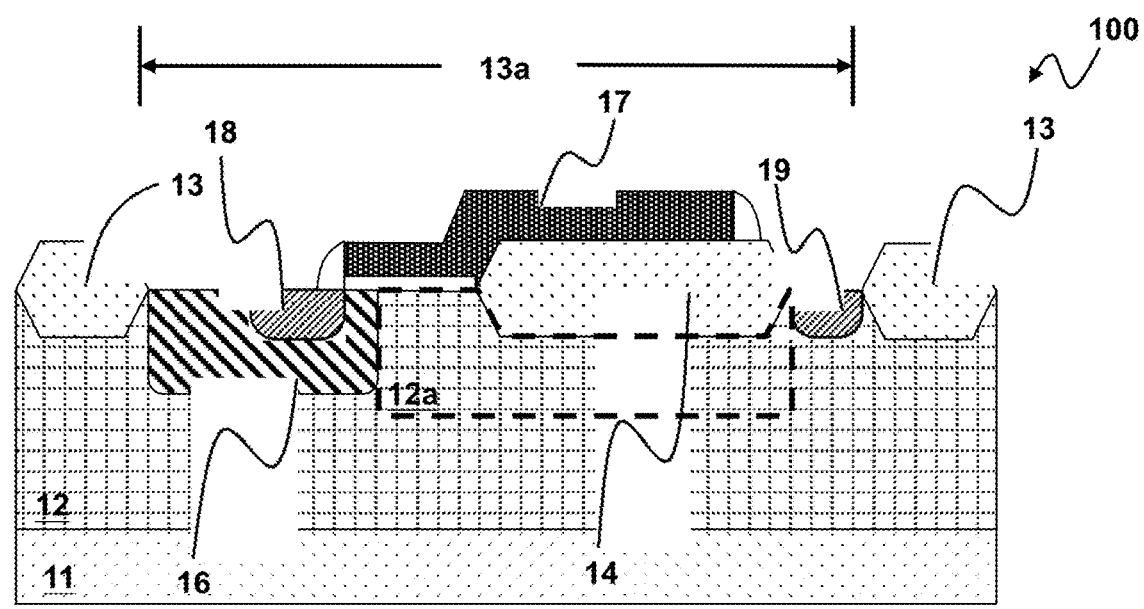
Figure 2A:
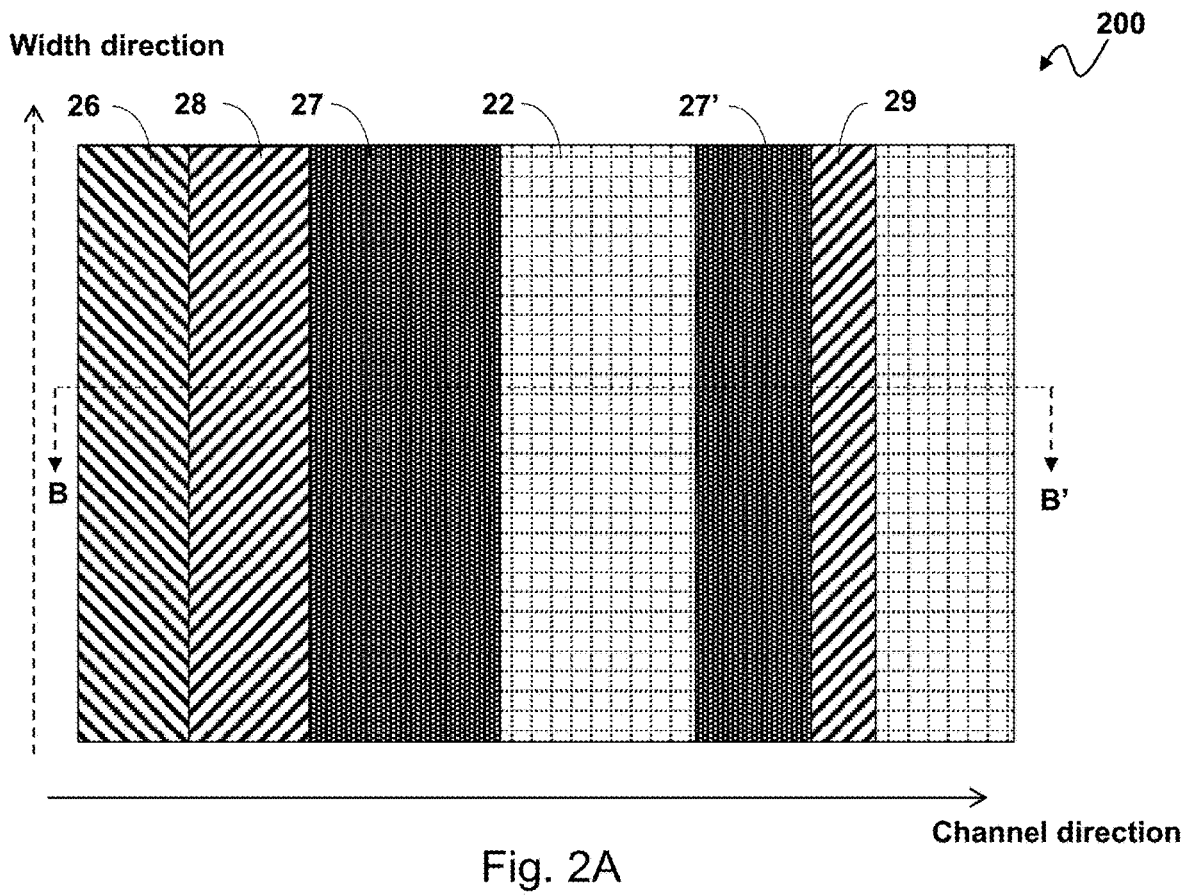
FIGS. 2A and 2B show a top view and a cross-sectional view, respectively, of a power device in accordance with a first embodiment of the present invention.
Figure 2B:
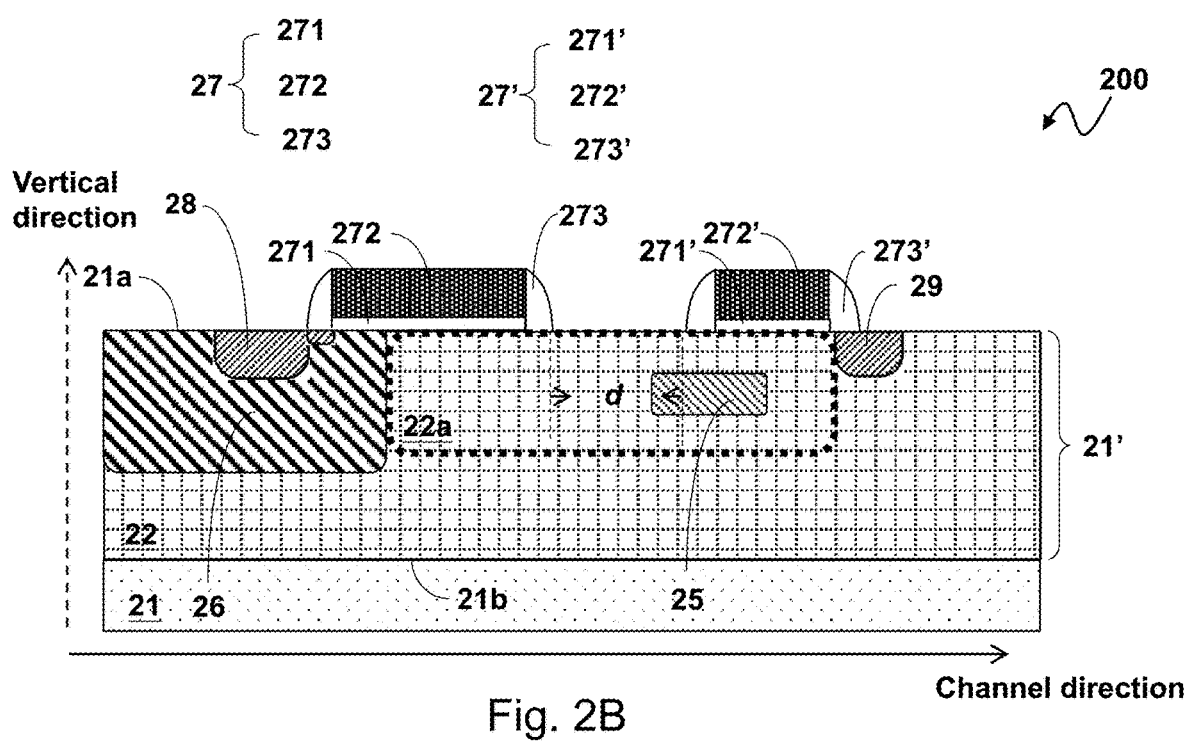

Please refer to FIGS. 2A and 2B, which show a first embodiment of the present invention. FIG. 2A show a top view of a power device 200 according to the present invention, and FIG. 2B shows a cross-sectional view taken along a cross-section line BB' in FIG. 2A. As shown in FIGS. 2A and 2B, the power device 200 includes: a semiconductor layer 21', a well region 22, an electric field adjustment region 25, a body region 26, a gate 27, a sub-gate 27', a source 28, and a drain 29. The semiconductor layer 21' is formed on the substrate 21; the well region 22, the source 28 and the drain 29 have a first conductivity type; the body region 26 and the electric field adjustment region 25 have a second conductivity type. The power device 200 is, for example, a lateral double-diffused metal oxide semiconductor field effect transistor (LDMOS) device as shown in FIGS. 2A and 2B. The power device according to the present invention can be used in, for instance, a power stage circuit of a switching regulator. The switching regulator is well known to the person having ordinary skill in the art, and therefore the description thereof is omitted.

The semiconductor layer 21' is formed on the substrate 21, and the semiconductor layer 21' has a top surface 21a and a bottom surface 21b opposite to the top surface 21a in a vertical direction (as indicated by the direction of the dashed arrow in FIG. 2B). The substrate 21 is, for example but not limited to, a P-type or N-type semiconductor silicon substrate. The semiconductor layer 21', for example, is formed on the substrate 21 by epitaxy, or, a part of the substrate 21 is used to form the semiconductor layer 21'. The semiconductor layer 21' can be formed by various methods known to the person having ordinary skill in the art, so the details thereof are not redundantly explained here.

Please still refer to FIGS. 2A and 2B. The well region 22 which has a first conductivity type is formed in the semiconductor layer 21', and the well region 22 is located beneath the top surface 21a and in contact with the top surface 21a. The body region 26 which has a second conductivity type is formed in the well region 22, and the body region 26 is located beneath the top surface 21a and in contact with the top surface 21a. The body region 26 is adjacent to the well region 22 in the channel direction (as indicated by the direction of the solid arrow in FIG. 2B). The gate 27 is formed on the top surface 21a. A portion of the body region 26 is located vertically beneath the gate 27 and in contact with the gate 27, to provide an inverse current channel of the power device 200 during ON operation. A portion of the well region 22 is located vertically beneath the gate 27, to provide a drift current channel (as indicated by the thick dotted line in FIG. 2B) of the power device 200 during ON operation. The sub-gate 27' is formed above the top surface 21a, and a portion of the well region 22 is located vertically beneath the sub-gate 27'. The sub-gate 27' and the gate 27 are two separate independent structures and are not directly connected with each other. The source 28 and the drain 29 have the first conductivity type. The source 28 and the drain 29 are formed beneath the top surface 21a and in contact with the top surface 21a. The source 28 is located in the body region 26 under and outside of the gate 27, and the drain 29 is located in the well region 22 and away from the body region 26. From the top view of FIG. 2A, the sub-gate 27' is located between the gate 27 and the drain 29. The electric field adjustment region 25 has a second conductivity type. The electric field adjustment region 25 is formed beneath the top surface 21a and is not in contact with the top surface 21a. The electric field adjustment region 25 is located in the well region 22 in the semiconductor layer 21', and at least a portion of the electric field adjustment region 25 is located vertically beneath the sub-gate 27'.

The gate 27 includes a dielectric layer 271 in contact with the top surface 21a, a conductive layer 272 which is electrically conductive, and a spacer layer 273 which is electrically insulative. The gate 27 is configured to receive control signals, so as to control the power device 200 to be ON or OFF.

The sub-gate 27' includes a dielectric layer 271' in contact with the top surface 21a, a conductive layer 272' which is electrically conductive, and a spacer layer 273' which is electrically insulative. The sub-gate 27' has no function of controlling the power device 200 to be ON or OFF when the power device 200 operates. There is a distance d which is larger than 0 between the sub-gate 27' and the gate 27 in the channel direction. In one preferred embodiment, the sub-gate 27' and the gate 27 may be formed by the same lithography process, the same deposition process and the same etching process. The sub-gate 27' and the gate 27 are two separate independent structures and are not directly connected with each other.

Please refer to FIG. 2B. The drift region 22a is located between the drain 29 and the body region 26 in the channel direction and the drift region 22a serves to separate the drain 29 and the body region 26. The drift region 22a is located in the well region 22 near the top surface 21a, to serve as a drift current channel of the power device 200 during ON operation. The present invention is different from the power device 100 of the prior art in that, the present invention provides the electric field adjustment region in the well region 22, wherein the electric field adjustment region 25 is a region having a conductivity type opposite to that of the surrounding well region 22, so that when the power device 200 of this embodiment is OFF, a depletion region is formed to reduce the density of the electric field, whereby the breakdown voltage is enhanced, so as to increase the operation range of the power device 200. Furthermore, the present invention provides the sub-gate 27' which is formed above the top surface 21a and is arranged in parallel with the gate 27; when the power device 200 is OFF, the sub-gate 27' has a relatively higher electric field at an edge along the width direction (as indicated by the direction of the dashed arrow in FIG. 2A) such that the voltage obtained by integrating the electric field along the channel direction is higher; that is, the voltage during OFF operation is higher, and therefore the breakdown voltage during OFF operation is higher than the prior art. The sub-gate 27' is not conducted or is partially conducted when the power device 200 operates in ON operation (that is, when the voltage applied the gate 27 is higher than the threshold voltage), therefore, in the drift region 22a vertically beneath the sub-gate 27', the accumulated charges are less, resulting in a higher conduction resistance of the power device 200; however, this disadvantage is overridden by the advantage that the gate-drain capacitance is reduced, whereby the transient response and the operation speed of the power device 200 during ON operation are enhanced, so the applicable range of the power device 200 is improved.

The "inverse current channel" refers to: when the power device 200 operates in ON operation, due to the voltage applied to the gate 27, an inversion layer is formed beneath the gate 27 so that a conduction current flows through the region of the inversion layer, and this region is the "inverse current channel". "Inverse current channel" is known to a person having ordinary skill in the art, so the details thereof are not redundantly explained here.

The "drift current channel" refers to: when the power device 200 operates in ON operation, a conduction current flow through a region between the gate and drain (possibly including a portion under the gate) in a drifting manner. "Drift current channel" is known to a person having ordinary skill in the art, so the details thereof are not redundantly explained here.

Note that the top surface 21a as defined in the context of this invention does not mean a completely flat plane but refers to a surface of the semiconductor layer 21'. In one embodiment, for example, where the top surface 51a is in contact with the drift oxide region 54 in FIG. 5B is recessed.

The above-mentioned "first conductivity type" and "second conductivity type" indicate different conductivity types of impurities which are doped in regions or layers of the power device (such as but not limited to the aforementioned well region, body region and source and the drain, etc.), so that the doped region or layer has the first or second conductivity type; for example, the first conductivity type is N-type and the second conductivity type is P-type, or the opposite. The first conductivity type and the second conductivity type are conductivity types which are opposite to each other.

In addition, a power device, in the context of this invention, refers to a semiconductor device operating to transmit power, whose drain, when implemented by a metal-oxide-semiconductor field effect transistor (MOSFET), is typically required to receive a voltage which is higher than 5V during normal operation. Depending on the voltage that the power device requires to withstand, a lateral distance (drift distance) between the body region 26 and the drain 29 can be adjusted accordingly, to meet the requirement, which is known to a person having ordinary skill in the art, so the details thereof are not redundantly explained here.

Note that, in the present invention, the number of the sub-gate 27' is not limited to one as shown in FIGS. 2A and 2B. In other embodiments, it is also practicable and within the scope of the present invention that the number of the sub-gate 27' can be plural. The phrase "not directly connected with each other" means that the sub-gate 27' and the gate 27 are not in direct contact with each other.

Figure 3A:
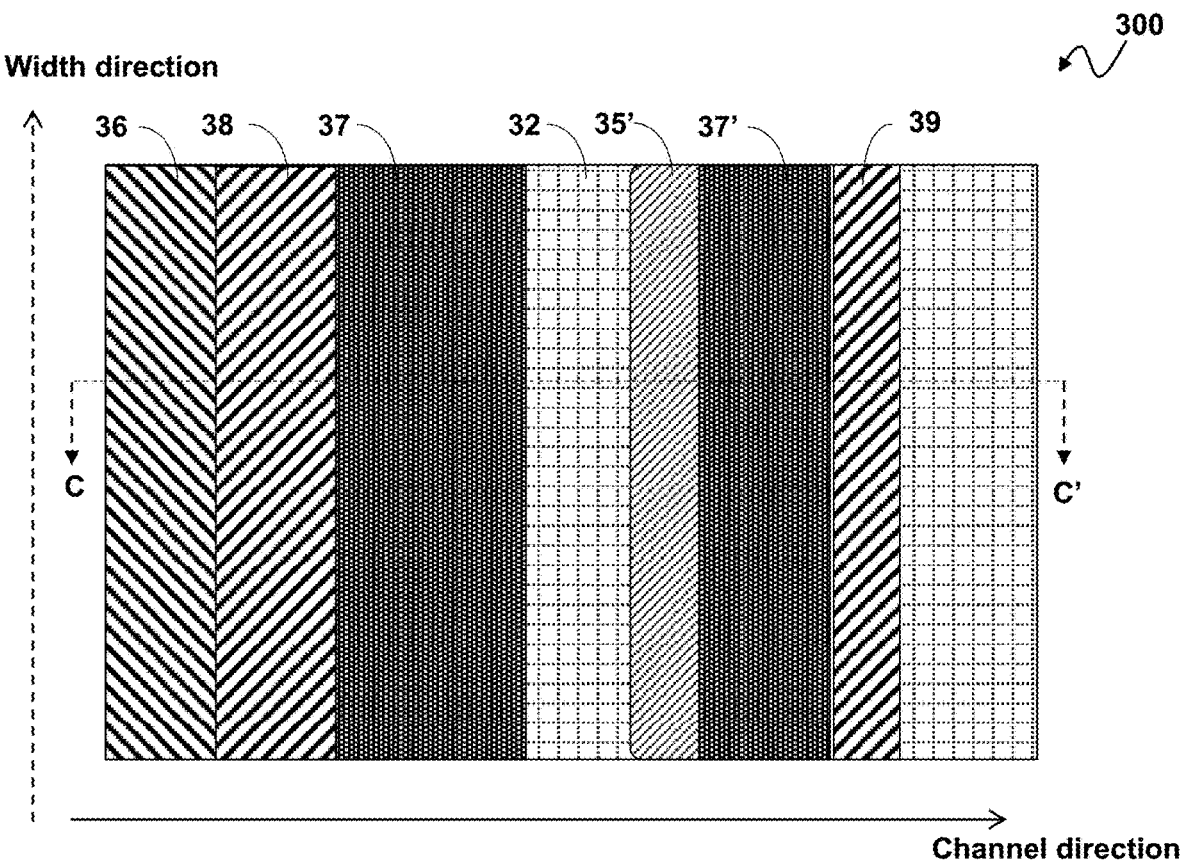
FIGS. 3A and 3B show a top view and a cross-sectional view, respectively, of a power device in accordance with a second embodiment of the present invention.
Figure 3B:
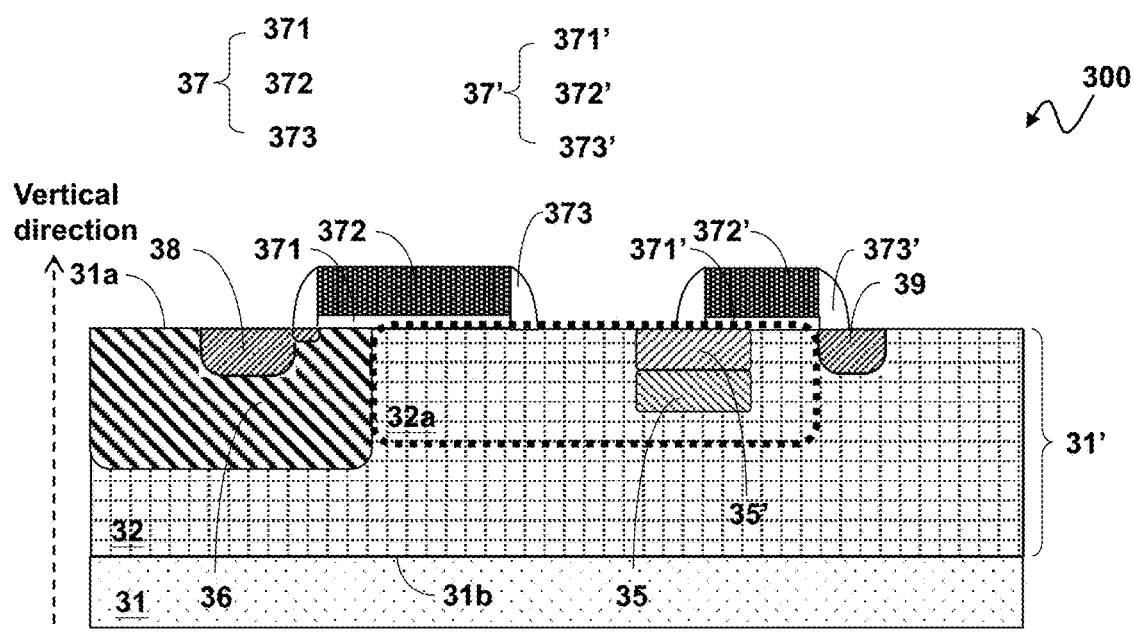

Please refer to FIGS. 3A and 3B, which show a second embodiment of the present invention. FIG. 3A shows a top view of a power device 300 according to the present invention and FIG. 3B shows a cross-sectional view taken along a cross-section line CC' in FIG. 3A. As shown in FIGS. 3A and 3B, the power device 300 includes: a semiconductor layer 31', a well region 32, an electric field adjustment region 35, a resistance adjustment region 35', a body region 36, a gate 37, a sub-gate 37', a source 38 and a drain 39. The well region 32, the resistance adjustment region 35', the source 38 and the drain 39 have a first conductivity type; the body region 36 and the electric field adjustment region 35 have a second conductivity type.

The semiconductor layer 31' is formed on the substrate 31 and has a top surface 31a and a bottom surface 31b opposite to the top surface 31a in the vertical direction (as indicated by the direction of dashed arrow in FIG. 3B). The substrate 31 is, for example but not limited to, a P-type or N-type semiconductor silicon substrate. The semiconductor layer 31', for example, is formed on the substrate 31 by epitaxy, or, a part of the substrate 31 is used to form the semiconductor layer 31'. The semiconductor layer 31' can be formed by various methods known to a person having ordinary skill in the art, so the details thereof are not redundantly explained here.

Please still refer to FIGS. 3A and 3B. The gate 37 includes a dielectric layer 371 in contact with the top surface 31a, a conductive layer 372 which is electrically conductive, and a spacer layer 373 which is electrically insulative. The gate 37 is configured to receive control signals, so as to control the power device 300 to be ON or OFF. The sub-gate 37' includes a dielectric layer 371' in contact with the top surface 31a, a conductive layer 372' which is electrically conductive, and a spacer layer 373' which is electrically insulative.

The present embodiment is different from the first embodiment in that, in the present embodiment, the power device 300 further includes the resistance adjustment region 35' which has the first conductivity type, and the resistance adjustment region 35' is formed beneath the top surface 31a and in contact with the top surface 31a. The resistance adjustment region 35' is located above the electric field adjustment region 35 in the well region 32 in the semiconductor layer 31', and the resistance adjustment region 35' is formed between the body region 36 and the drain 39. The concentration of the first conductivity type impurities in the resistance adjustment region 35' is higher than the concentration of the first conductivity type impurities in the well region 32. The resistance adjustment region 35' serves to reduce the conduction resistance of the power device 300. When the power device 300 operates in ON operation, the drift region 32a provides a drift current channel during ON operation. The resistance adjustment region 35' has a higher concentration of the first conductivity type impurities, thereby reducing the conduction resistance of the power device 300.

In one preferred embodiment, as shown in FIG. 3B, the electric field adjustment region 35 is in contact with the bottom of the resistance adjustment region 35'. Both the concentration of the second conductivity type impurities of the electric field adjustment region 35 and the concentration of the first conductivity type impurities of the resistance adjustment region 35' are in the range of about $1\times10^{16}$ atoms/cm$^3$ to about $9\times10^{16}$ atoms/cm$^3$. A PN junction between the electric field adjustment region 35 and the resistance adjustment region 35' forms a depletion region when the power device 300 operates in OFF operation, and the depletion region can assist in enhancing the breakdown voltage.

In one preferred embodiment, the resistance adjustment region 35' and the electric field adjustment region 35 are defined by the same lithography process, such that the electric field adjustment region 35 is located substantially completely beneath the resistance adjustment region 35' and the area of the PN junction between the electric field adjustment region 35 and the resistance adjustment region 35' is large.

In one preferred embodiment, the sub-gate 37' is electrically floating or electrically connected to the source 38, to enhance the operation speed of the power device 300 so that the applicable range of the power device 300 can be broadened.

In one preferred embodiment, the resistance adjustment region 35' and the electric field adjustment region 35 are completely not located vertically beneath the gate 37. Therefore, the gate-drain capacitance can be reduced, such that the transient response and the operation speed of the power device 300 during ON operation can be enhanced, to broaden the applicable range of the power device.

Figure 4A:
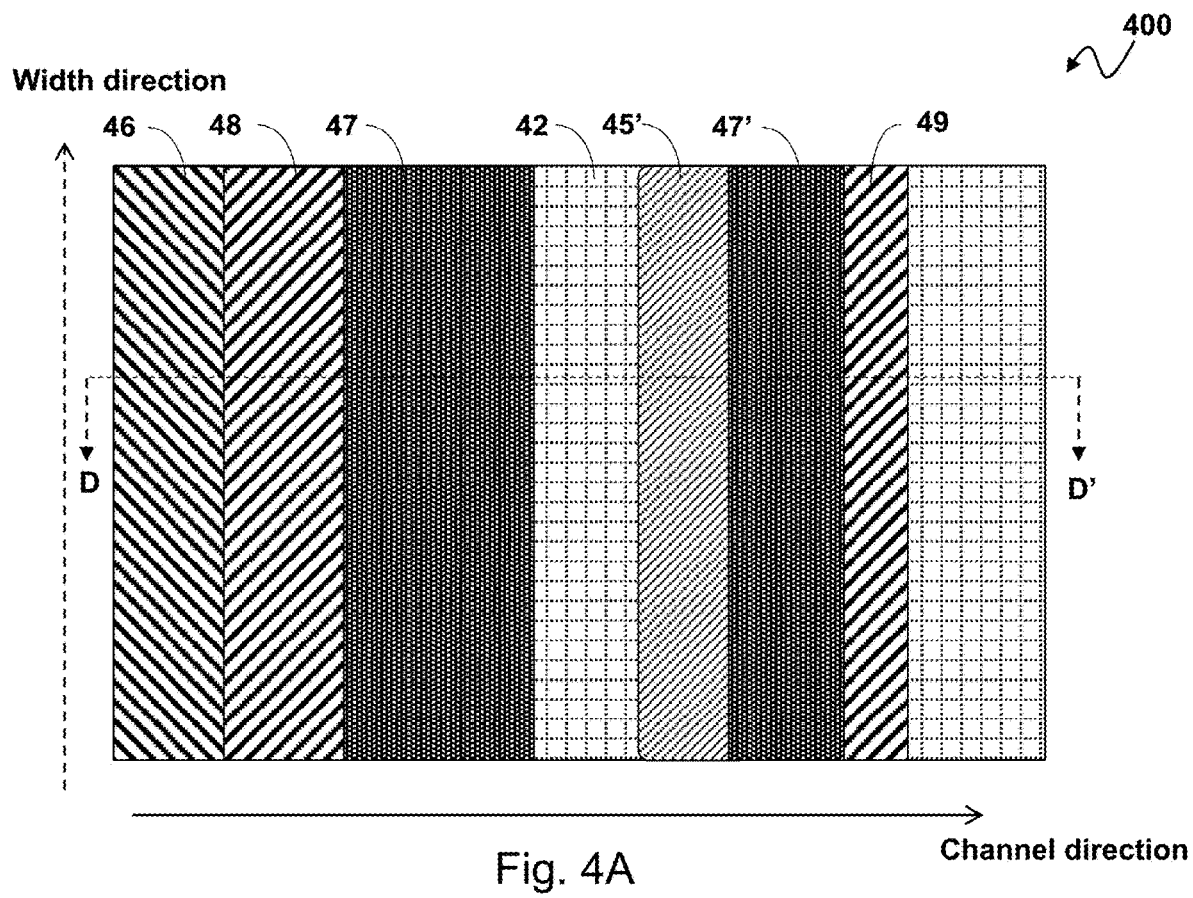
FIGS. 4A and 4B show a top view and a cross-sectional view, respectively, of a power device in accordance with a third embodiment of the present invention.
Figure 4B:
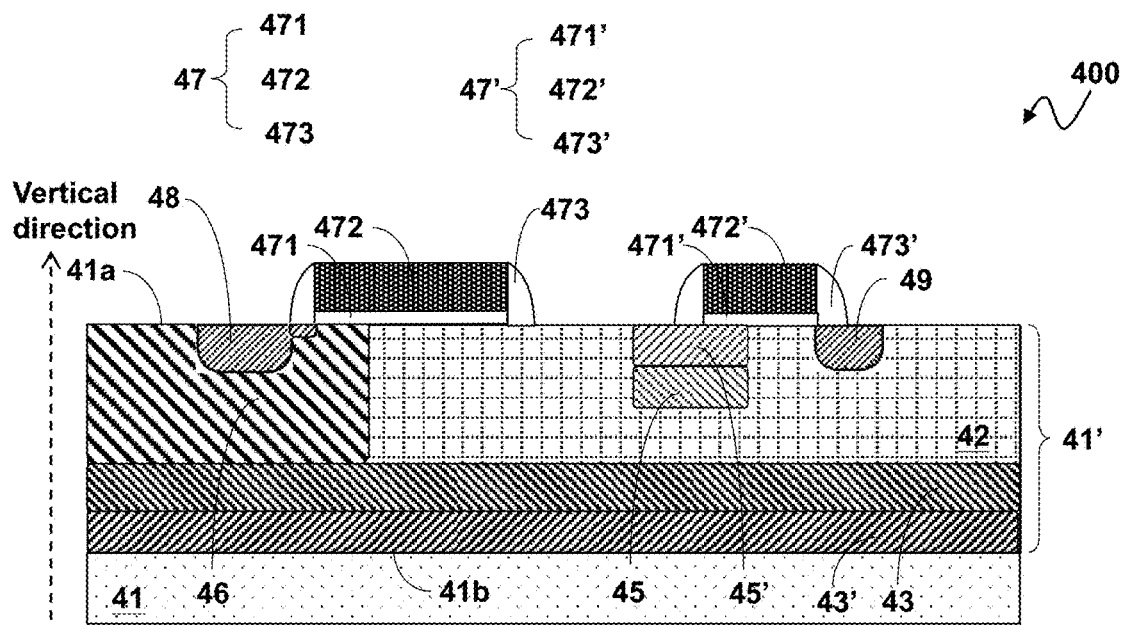

Please refer to FIGS. 4A and 4B, which show a third embodiment of the present invention. FIG. 4A shows a top view of a power device 400 according to the present invention, and FIG. 4B shows a cross-sectional view taken along a cross-section line DD' in FIG. 4A. As shown in FIGS. 4A and 4B, the power device 400 includes: a semiconductor layer 41', a well region 42, a first deep well region 43, a second deep well region 43', an electric field adjustment region 45, a resistance adjustment region 45', a body region 46, a gate 47, a sub-gate 47', a source 48 and a drain 49. The well region 42, the second deep well region 43', the resistance adjustment region 45', the source 48 and the drain 49 have a first conductivity type; the first deep well region 43, the body region 46 and the electric field adjustment region 45 have a second conductivity type.

The semiconductor layer 41' is formed on the substrate 41, and the semiconductor layer 41' has a top surface 41a and a bottom surface 41b opposite to the top surface 41a in the vertical direction (as indicated by the direction of the dashed arrow in FIG. 4B). The substrate 41 is, for example but not limited to, a P-type or N-type semiconductor silicon substrate. The semiconductor layer 41', for example, is formed on the substrate 41 by epitaxy, or, a part of the substrate 41 is used to form the semiconductor layer 41'. The semiconductor layer 41' can be formed by various methods known to a person having ordinary skill in the art, so the details thereof are not redundantly explained here.

Please still refer to FIGS. 4A and 4B. The gate 47 includes a dielectric layer 471 in contact with the top surface 41a, a conductive layer 472 which is electrically conductive, and a spacer layer 473 which is electrically insulative. The gate 47 is configured to receive control signals, so as to control the power device 400 to be ON or OFF. The sub-gate 47' includes a dielectric layer 471' in contact with the top surface 41a, a conductive layer 472' which is electrically conductive, and a spacer layer 473' which is electrically insulative.

The present embodiment is different from the second embodiment in that, in the present embodiment, the power device 400 further includes the first deep well region 43 and the second deep well region 43'. The first deep well region 43 has the second conductivity type. The first deep well region 43 is formed beneath the well region 42 and the body region 46 in the semiconductor layer 41'. In the semiconductor layer 41', the first deep well region 43 is completely in contact with and covers the bottoms of the well region 42 and the body region 46. The second deep well region 43' has the first conductivity type. The second deep well region 43' is formed beneath the first deep well region 43 in the semiconductor layer 41'. In the semiconductor layer 41', the second deep well region 43' is completely in contact with and covers the bottom of the first deep well region 43.

Figure 5A:
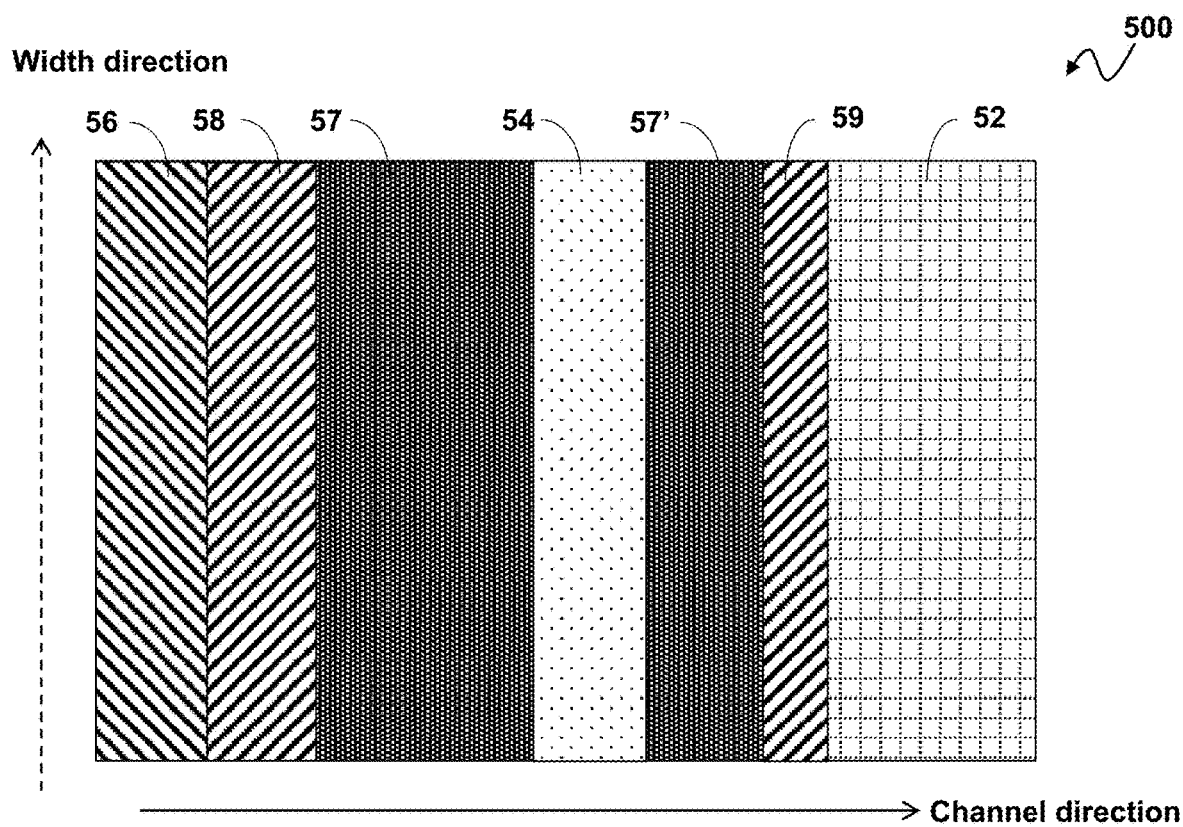
FIGS. 5A and 5B show a top view and a cross-sectional view, respectively, of a power device in accordance with a fourth embodiment of the present invention.
Figure 5B:
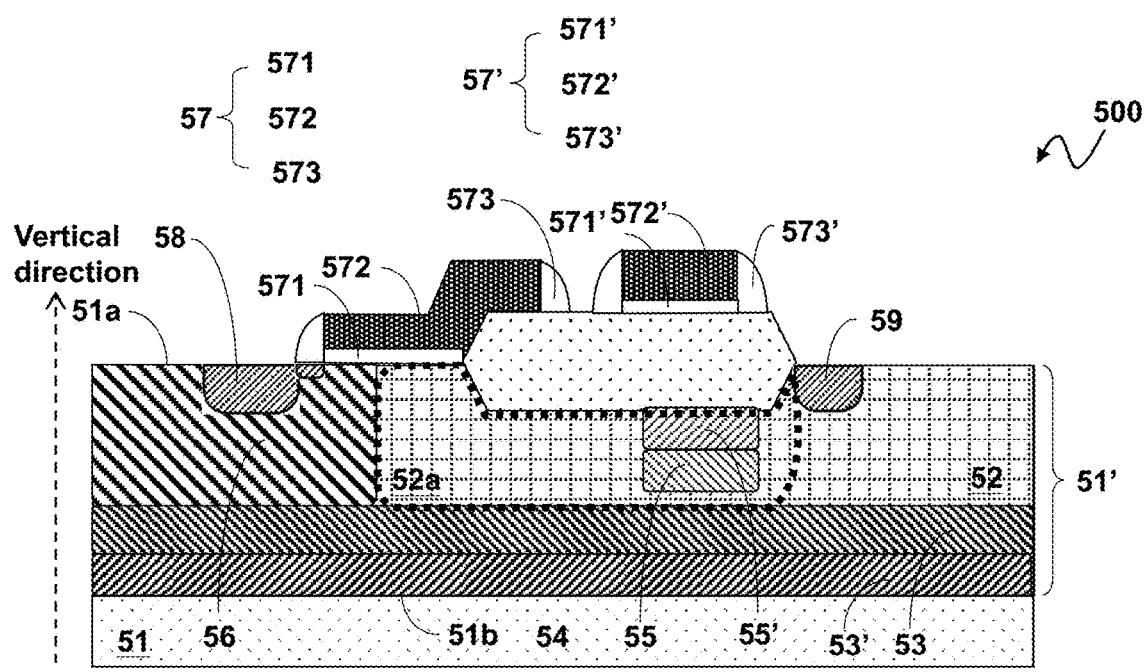

Please refer to FIGS. 5A and 5B, which show a fourth embodiment of the present invention. FIG. 5A shows a top view of a power device 500 according to the present invention, and FIG. 5B shows a cross-sectional view taken along a cross-section line EE' in FIG. 5A. As shown in FIGS. 5A and 5B, the power device 500 includes: a semiconductor layer 51', a well region 52, a first deep well region 53, a second deep well region 53', a drift oxide region 54, an electric field adjustment region 55, a resistance adjustment region 55', a body region 56, a gate 57, a sub-gate 57', a source 58, and a drain 59. The well region 52, the second deep well region 53', the resistance adjustment region 55', the source 58 and the drain 59 have a first conductivity type; the first deep well region 53, the body region 56 and the electric field adjustment region 55 have a second conductivity type.

The semiconductor layer 51' is formed on the substrate 51, and the semiconductor layer 51' has a top surface 51a and a bottom surface 51b opposite to the top surface 51a in the vertical direction (as indicated by the direction of the dashed arrow in FIG. 5B). The substrate 51 is, for example but not limited to, a P-type or N-type semiconductor silicon substrate. The semiconductor layer 51', for example, is formed on the substrate 51 by epitaxy, or, a part of the substrate 51 is used to form the semiconductor layer 51'. The semiconductor layer 51' can be formed by various methods known to a person having ordinary skill in the art, so the details thereof are not redundantly explained here.

Please still refer to FIGS. 5A and 5B. The gate 57 includes a dielectric layer 571 in contact with the top surface 51a, a conductive layer 572 which is electrically conductive, and a spacer layer 573 which is electrically insulative. The gate 57 is configured to receive control signals, so as to control the power device 500 to be ON or OFF. The sub-gate 57' includes a dielectric layer 571' in contact with the top surface 51a, a conductive layer 572' which is electrically conductive, and a spacer layer 573' which is electrically insulative.

The present embodiment is different from the third embodiment in that, in the present embodiment, the power device 500 further includes a drift oxide region 54 which is formed above and in contact with the top surface 51a, so as to enhance the breakdown voltage. The drift oxide region 54 is, for example but not limited to, local oxidation of silicon (LOCOS) structure as shown in figure, or may instead be a shallow trench isolation (STI) structure. The drift oxide region 54 is in contact with the drift region 52a. The drift oxide region 54 is formed above the top surface 51a and in contact with the sub-gate 57', and at least a portion of the resistance adjustment region 55' and the electric field adjustment region 55 is located vertically beneath the drift oxide region 54.

Figure 6:
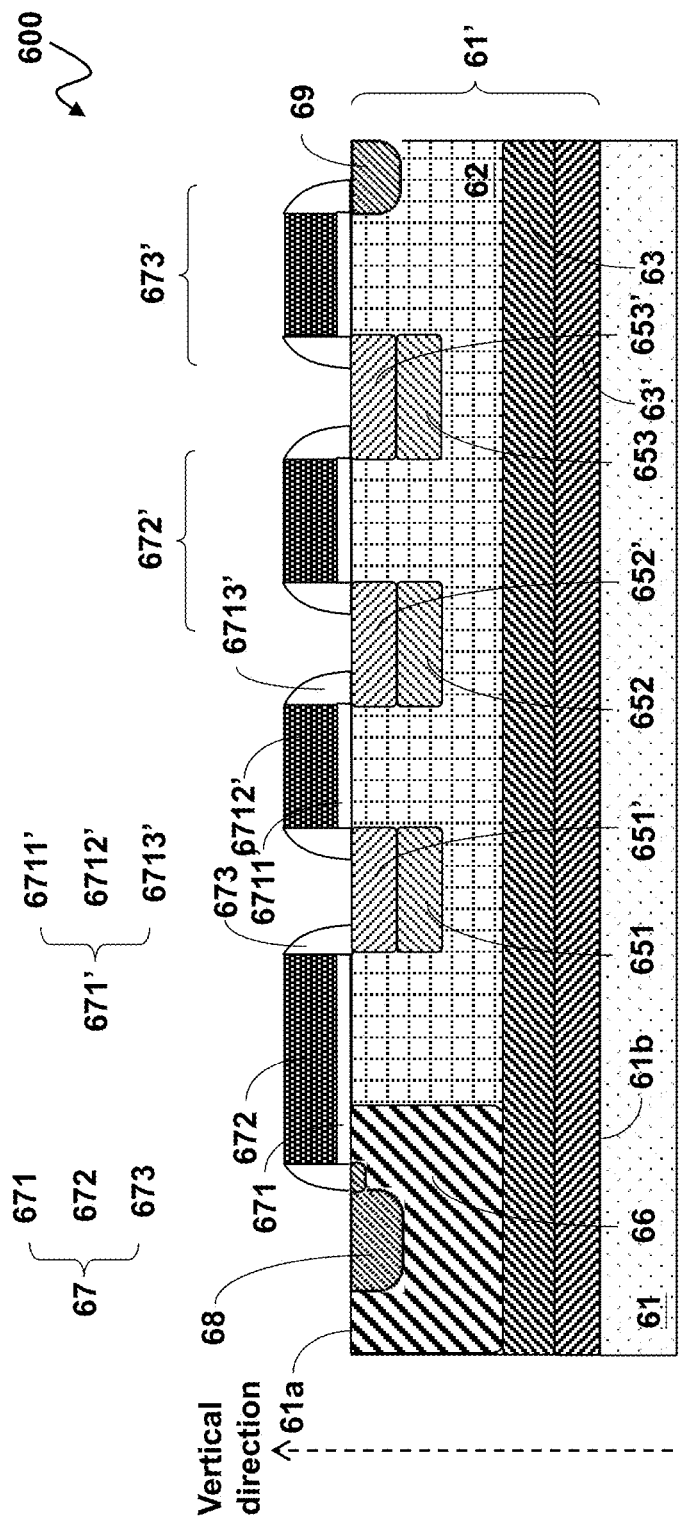
FIG. 6 shows a cross-sectional view of a power device in accordance with a fifth embodiment of the present invention.

Please refer to FIG. 6, which shows a fifth embodiment of the present invention. FIG. 6 shows a cross-sectional view of a power device 600. As shown in FIG. 6, the power device 600 includes: a semiconductor layer 61', a well region 62, a first deep well region 63, a second deep well region 63', plural electric field adjustment regions 651, 652 and 653, plural resistance adjustment regions 651', 652' and 653', a body region 66, a gate 67, plural sub-gates 671', 672' and 673', a source 68, and a drain 69. The well region 62, the second deep well region 63', the resistance adjustment regions 651', 652' and 653', the source 68 and the drain 69 have a first conductivity type; the first deep well region 63, the body region 66 and the electric field adjustment region 651, 652 and 653 have a second conductivity type.

The semiconductor layer 61' is formed on the substrate 61, and the semiconductor layer 61' has a top surface 61a and a bottom surface 61b opposite to the top surface 61a in the vertical direction (as indicated by the direction of the dashed arrow in FIG. 6). The substrate 61 is, for example but not limited to, a P-type or N-type semiconductor silicon substrate. The semiconductor layer 61', for example, is formed on the substrate 61 by epitaxy, or, a part of the substrate 61 is used to form the semiconductor layer 61'. The semiconductor layer 61' can be formed by various methods known to a person having ordinary skill in the art, so the details thereof are not redundantly explained here.

Please still refer to FIG. 6. The gate 67 includes a dielectric layer 671 in contact with the top surface 61a, a conductive layer 672 which is electrically conductive, and a spacer layer 673 which is electrically insulative. The gate 67 is configured to receive control signals, so as to control the power device 600 to be ON or OFF. The sub-gate 671' includes a dielectric layer 6711' in contact with the top surface 61a, a conductive layer 6712' which is electrically conductive, and a spacer layer 6713' which is electrically insulative.

In the present embodiment, the plural resistance adjustment regions 651', 652' and 653' and the plural electric field adjustment regions 651, 652 and 653 are defined by corresponding sub-gates 671', 672' and 673'. As shown in FIG. 6, the resistance adjustment region 651' and the electric field adjustment region 651 are defined by the gate 67 and the sub-gate 671'; the resistance adjustment region 652' and the electric field adjustment region 652 are defined by the sub-gate 671' and the sub-gate 672'; the resistance adjustment region 653' and the electric field adjustment region 653 are defined by the sub-gate 672' and the sub-gate 673'.

Figure 7A:
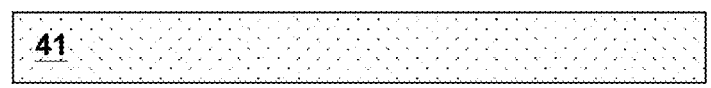
FIGS. 7A-7F show cross-sectional views illustrating a manufacturing method of a power device in accordance with a sixth embodiment of the present invention.
Figure 7B:
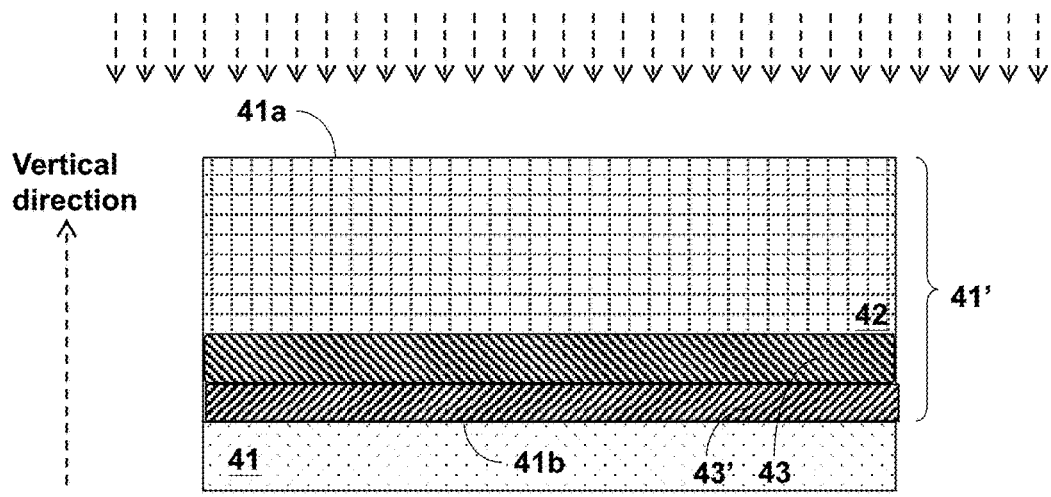

Please refer to FIGS. 7A to 7F, which show a sixth embodiment of the present invention. FIGS. 7A to 7F show cross-sectional views of a manufacturing method of a power device 400 at the present invention. As shown in FIG. 7A, first, a substrate 41 is provided. The substrate 41 is, for example but not limited to, a P-type or N-type semiconductor silicon substrate. Then, as shown in FIG. 7B, a semiconductor layer 41' is formed on the substrate 41, and the semiconductor layer 41' has a top surface 41a and a bottom surface 41b opposite to the top surface 41a in the vertical direction (as indicated by the direction of the dashed arrow in FIG. 7B). The semiconductor layer 41' is, for example, formed on the substrate 41 by epitaxy, or, a part of the substrate 41 is used to form the semiconductor layer 41'. The semiconductor layer 41' can be formed by various methods known to a person having ordinary skill in the art, so the details thereof are not redundantly explained here.

Please still refer to FIG. 7B. Subsequently, a first deep well region 43, a second deep well region 43' and a well region 42 are formed in the semiconductor layer 41', and the well region 42 is located beneath and in contact with the top surface 41a in the vertical direction. The well region 42 has a first conductivity type, which for example can be formed by implanting the first conductivity type impurities into the semiconductor layer 41' in the form of accelerated ions in an ion implantation step, as shown by the dashed arrows in FIG. 7B. The first deep well region 43 and the second deep well region 43' can be formed by implanting the second conductivity type impurities and the first conductivity type impurities into a lower portion of the well region 42 in the semiconductor layer 41' in the form of accelerated ions in different ion implantation steps respectively. The first deep well region 43 has the second conductivity type. The first deep well region 43 is formed beneath the well region 42 and the body region 46 in the semiconductor layer 41'. In the semiconductor layer 41', the first deep well region 43 is completely in contact with and covers the bottoms of the well region 42 and the body region 46. The second deep well region 43' has the first conductivity type. The second deep well region 43' is formed beneath the first deep well region 43 in the semiconductor layer 41'. In the semiconductor layer 41', the second deep well region 43' is completely in contact with and covers the bottom of the first deep well region 43.

Figure 7C:
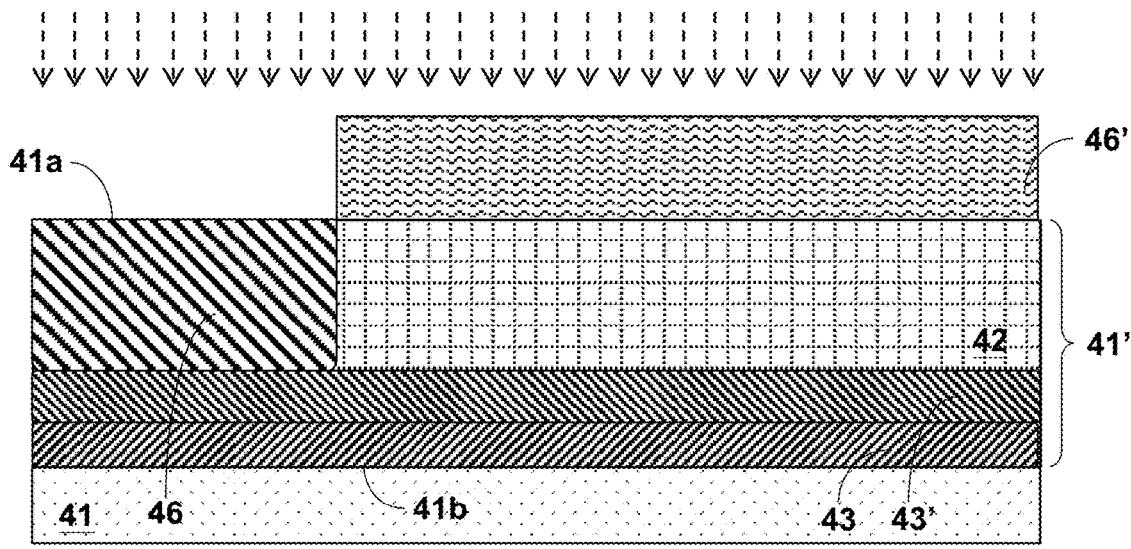

Then, please refer to FIG. 7C. A body region 46 is formed in the semiconductor layer 41', and the body region 46 is located beneath and in contact with the top surface 41a. The body region 46 is adjacent to the well region 42 in the channel direction (as indicated by the direction of the solid arrow in FIG. 4A). A portion of the body region 46 is located vertically beneath and in contact with the subsequently formed gate 47, to provide an inverse current channel of the power device 400 during ON operation. The body region 46 has the second conductivity type, which for example can be formed by using a photoresist layer 46' formed by a lithography process step as a mask and doping the second conductivity type impurities into the well region 42 in the semiconductor layer 41', so as to counter-dope the defined portion in the well region 42 to form the body region 46. In the present embodiment, the second conductivity type impurities can be implanted into a portion of the well region 42 in the form of accelerated ions in an ion implantation step, so as to form the body region 46.

Figure 7D:
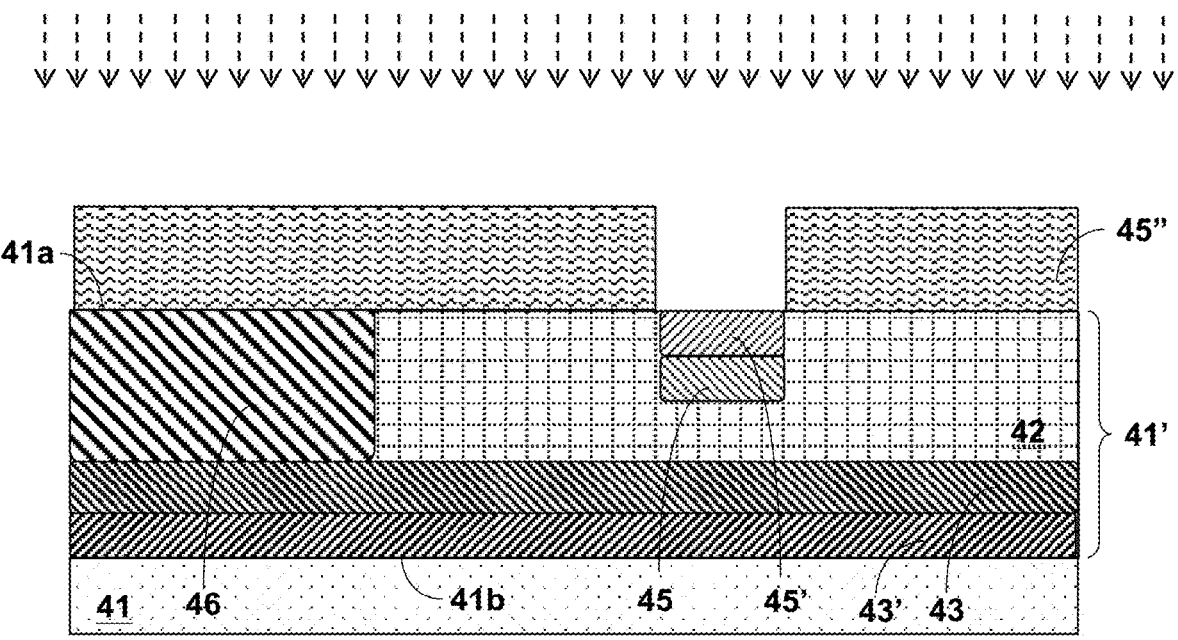

Subsequently, please refer to FIG. 7D. An electric field adjustment region 45 and a resistance adjustment region 45' are formed. The electric field adjustment region 45 is formed beneath the top surface 41a and is not in contact with the top surface 41a. The electric field adjustment region 45 has a second conductivity type. The electric field adjustment region 45 is located in the well region 42 in the semiconductor layer 41'. The resistance adjustment region 45' has the first conductivity type, and the resistance adjustment region 45' is formed beneath and in contact with the top surface 41a. The resistance adjustment region 45' is in contact with the top of the electric field adjustment region 45 in the well region 42 in the semiconductor layer 41', and the resistance adjustment region 45' is formed between the body region 46 and the subsequently formed drain 49. The concentration of the first conductivity type impurities in the resistance adjustment region 45' is higher than the concentration of the first conductivity type impurities in the well region 42. The resistance adjustment region 45' serves to reduce the conduction resistance of the power device 400.

The electric field adjustment region 45 and the resistance adjustment region 45', for example, can be formed by using a photoresist layer 45" formed by a lithography process step as a mask and sequentially doping the second conductivity type impurities and the first conductivity type impurities into the well region 42 in the semiconductor layer 41', so as to form the electric field adjustment region 45 and the resistance adjustment region 45'. In the present embodiment, one same lithography process can be used to form one photoresist layer 45" as the mask for both the electric field adjustment region 45 and the resistance adjustment region 45', and the second conductivity type impurities and the first conductivity type impurities can be implanted sequentially into the well region 42 in the form of accelerated ions in two ion implantation steps, so as to form the electric field adjustment region 45 and the resistance adjustment region 45'.

Figure 7E:
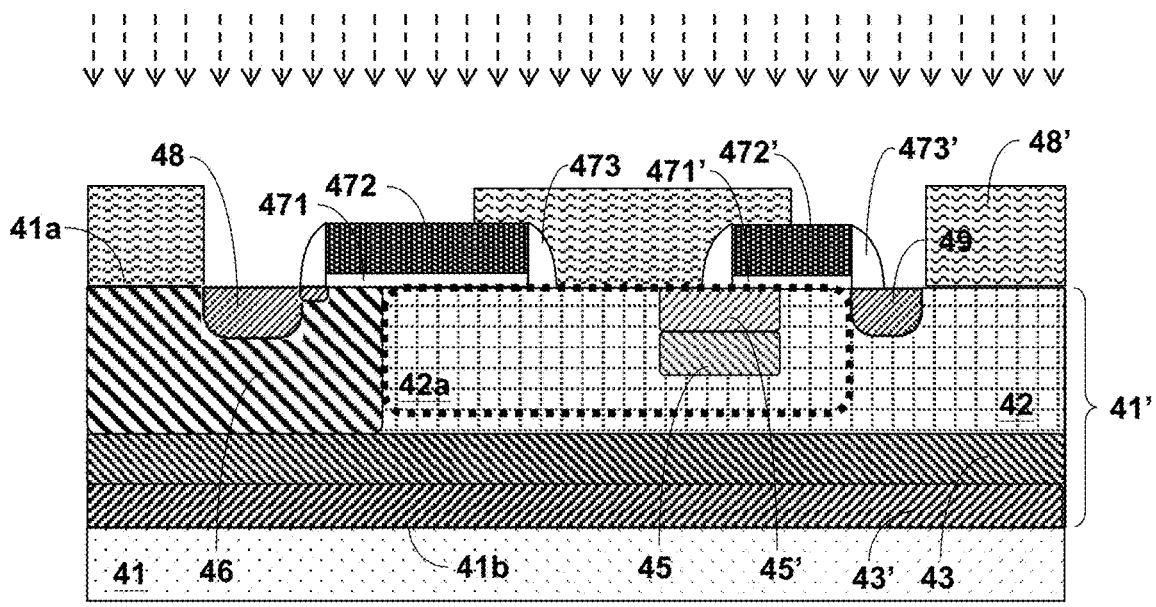

Next, please refer to FIG. 7E. A gate 47 and a sub-gate 47' are formed above the top surface 41a of the semiconductor layer 41'; and, a source 48 and a drain 49 are formed. A portion of the body region 46 is located vertically beneath the gate 47 and in contact with the gate 47, to provide an inverse current channel of the power device 400 during ON operation. A portion of the well region 42 is located vertically beneath the gate 47, to provide adrift current channel of the power device 400 during ON operation.

The sub-gate 47' is formed above the top surface 41a, and a portion of the well region 42 is located vertically beneath the sub-gate 47'. The sub-gate 47' and the gate 47 are two separate independent structures which are not directly connected with each other. The source 48 and the drain 49 have the first conductivity type. The source 48 and the drain 49 are formed beneath the top surface 41a and in contact with the top surface 41a. The source 48 is located in the body region 46 under and outside of the gate 47, and the drain 49 is located in the well region 42 and away from the body region 46. From the top view of FIG. 4A, the sub-gate 47' is located between the gate 47 and the drain 49.

The gate 47 includes a dielectric layer 471 in contact with the top surface 41a, a conductive layer 472 which is electrically conductive, and a spacer layer 473 which is electrically insulative. The gate 47 is configured to receive control signals, so as to control the power device 400 to be ON or OFF.

The sub-gate 47' includes a dielectric layer 471' in contact with the top surface 41a, a conductive layer 472' which is electrically conductive, and a spacer layer 473' which is electrically insulative. The sub-gate 47' has no function of controlling the power device 400 to be ON or OFF when the power device 400 operates. There is a distance which is larger than 0 between the sub-gate 47' and the gate 47 in the channel direction. The sub-gate 47' and the gate 47 may be formed by one same lithography process, one same deposition process and one same etching process.

Please still refer to FIG. 7E. A source 48 and a drain 49 are formed beneath and in contact with the top surface 41a. The source 48 is located in the body region 46 under and outside of the gate 47 in the channel direction, and the drain 49 is located in the well region 42 and away from the body region 46. The drift region 42a is located between the drain 49 and the body region 46 in the channel direction, in the well region 42 near the top surface 41a, to serve as a drift current channel of the power device 400 during ON operation. From the top view of FIG. 4A, the sub-gate 47' is located between the gate 47 and the drain 49 in the channel direction. The source 48 and the drain 49 can be formed by, for example but not limited to, using the gate 47, the sub-gate 47' and a photoresist layer 48' formed by a lithography process step as a mask, and doping the first conductivity type impurities into the body region 46 and the well region 42, so as to form the source and the drain 49. In the present embodiment, the first conductivity type impurities can be implanted into the body region 46 and the well region 42 in the form of accelerated ions in an ion implantation process step, so as to form the source 48 and the drain 49.

Figure 7F:
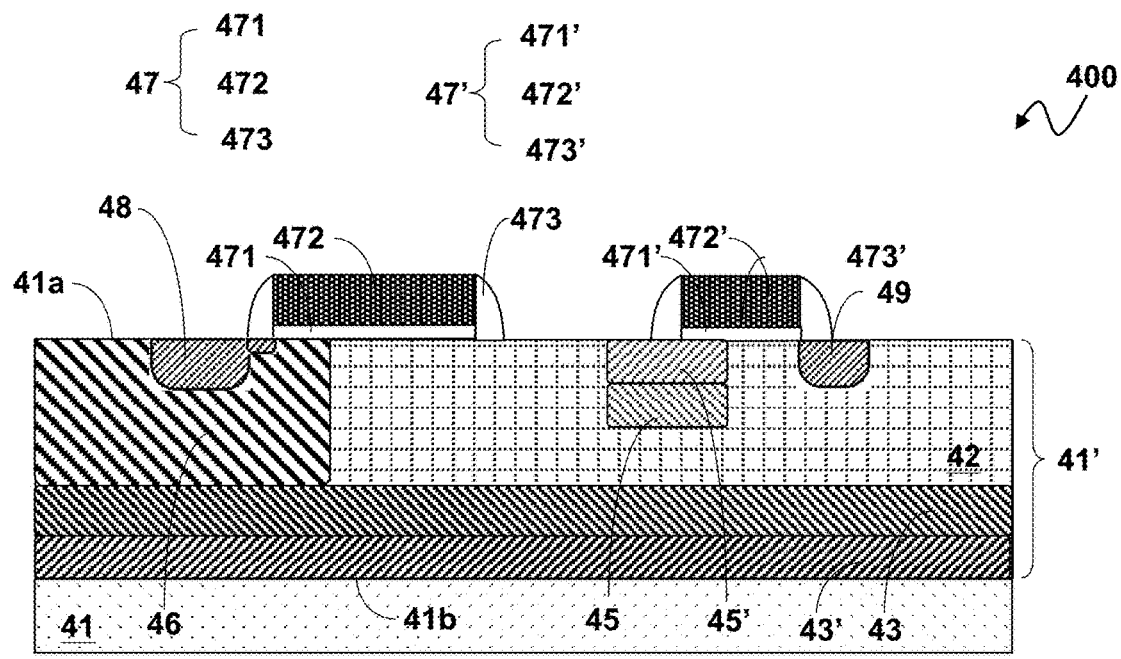

Subsequently, please refer to FIG. 7F. After the photoresist layer 48' is removed, the power device 400 is formed.

Figure 8A:
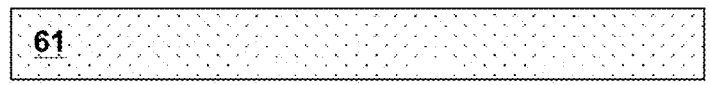
FIGS. 8A-8G show cross-sectional views illustrating a manufacturing method of a power device in accordance with a seventh embodiment of the present invention.
Figure 8B:
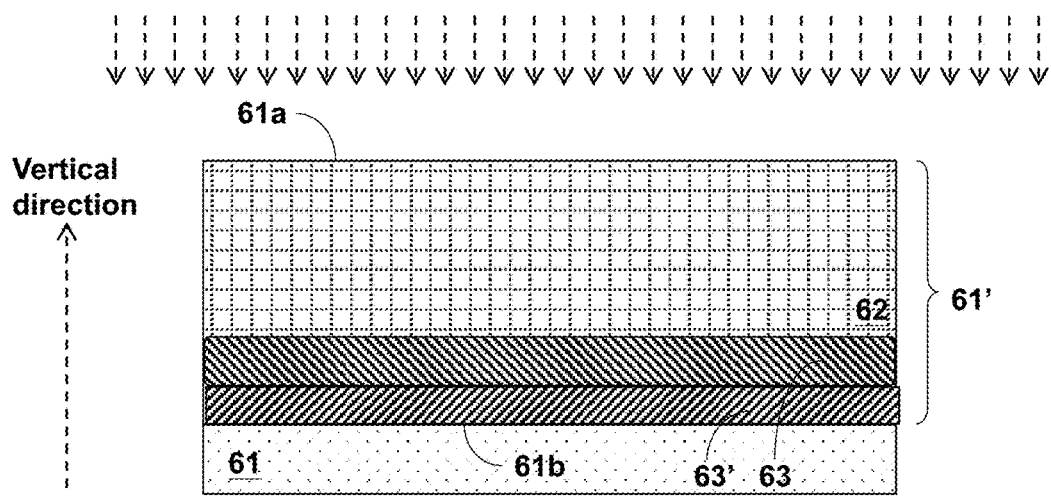

Please refer to FIGS. 8A-8G, which show a seventh embodiment of the present invention. FIGS. 8A-8G show cross-sectional views illustrating a manufacturing method of a power device 600. As shown in FIG. 8A, first, a substrate 61 is provided. The substrate 61 is, for example but not limited to, a P-type or N-type semiconductor silicon substrate. Then, as shown in FIG. 8B, a semiconductor layer 61' is formed on the substrate 61, and the semiconductor layer 61' has a top surface 61a and a bottom surface 61b opposite to the top surface 61a in the vertical direction (as indicated by the direction of the dashed arrow in FIG. 8B). The semiconductor layer 61' is, for example, formed on the substrate 61 by epitaxy, or, a part of the substrate 61 is used to form the semiconductor layer 61'. The semiconductor layer 61' can be formed by various methods known to a person having ordinary skill in the art, so the details thereof are not redundantly explained here.

Please still refer to FIG. 8B. Subsequently, a first deep well region 63, a second deep well region 63' and a well region 62 are formed in the semiconductor layer 61', and the well region 62 is located beneath and in contact with the top surface 61a in the vertical direction. The well region 62 has a first conductivity type, which for example can be formed by implanting the first conductivity type impurities into the semiconductor layer 61' in the form of accelerated ions in an ion implantation step, as shown by the dashed arrows in FIG. 8B. The first deep well region 63 and the second deep well region 63' can be formed by implanting the second conductivity type impurities and the first conductivity type impurities into a lower portion of the well region 62 in the semiconductor layer 61' in the form of accelerated ions in different ion implantation steps respectively. The first deep well region 63 has the second conductivity type. The first deep well region 63 is formed beneath the well region 62 and the body region 66 in the semiconductor layer 61'. In the semiconductor layer 61', the first deep well region 63 is completely in contact with and covers the bottoms of the well region 62 and the body region 66. The second deep well region 63' has the first conductivity type. The second deep well region 63' is formed beneath the first deep well region 63 in the semiconductor layer 61'. In the semiconductor layer 61', the second deep well region 63' is completely in contact with and covers the bottom of the first deep well region 63.

Figure 8C:
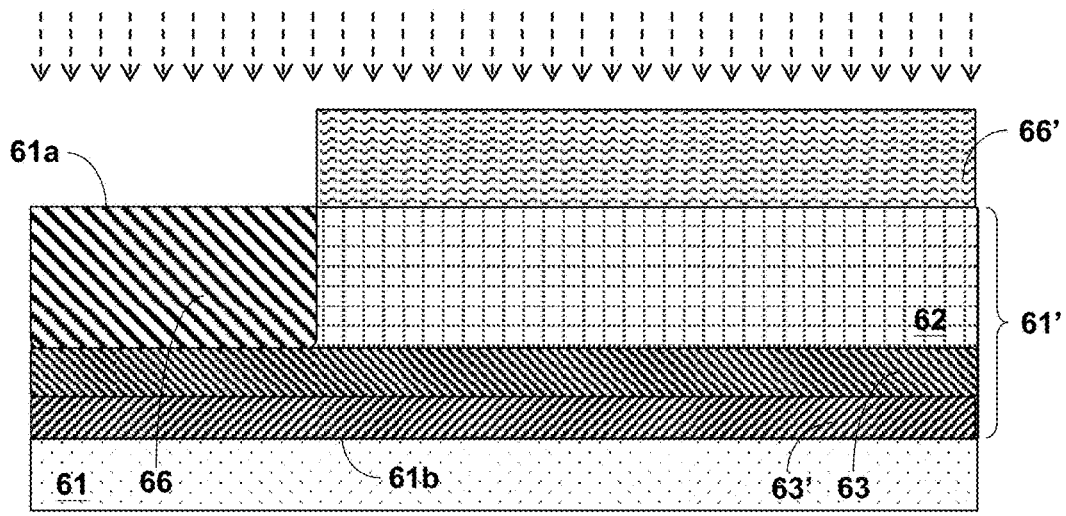

Then, please refer to FIG. 8C. A body region 66 is formed in the semiconductor layer 61', and the body region 66 is located beneath and in contact with the top surface 61a. The body region 66 is adjacent to the well region 62 in the channel direction (as indicated by the direction of the solid arrow in FIG. 8A). A portion of the body region 66 is located vertically beneath and in contact with the subsequently formed gate 67, to provide an inverse current channel of the power device 600 during ON operation. The body region 66 has the second conductivity type, which for example can be formed by using a photoresist layer 66' formed by a lithography process step as a mask and doping the second conductivity type impurities into the well region 62 in the semiconductor layer 61', so as to counter-dope the defined portion in the well region 62 to form the body region 66. In the present embodiment, the second conductivity type impurities can be implanted into a portion of the well region 62 in the form of accelerated ions in an ion implantation step, so as to form the body region 66.

Figure 8D:
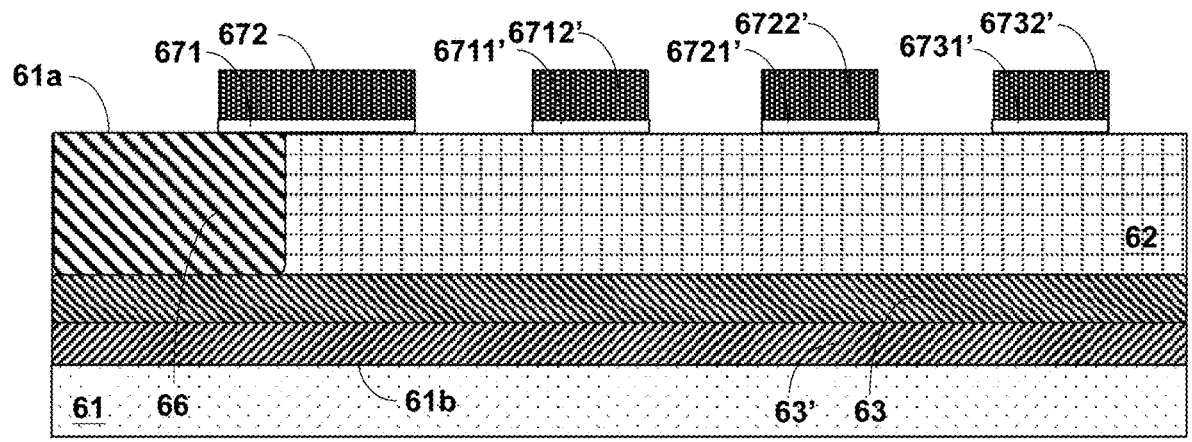

Subsequently, please refer to FIG. 8D. A dielectric layer 671 and a conductive layer 672 of a gate 67, and plural dielectric layers 6711', 6721' and 6731' and plural conductive layers 6712', 6722' and 6732' of plural sub-gates 671', 672' and 673' are formed above the top surface 61a of the semiconductor layer 61'. The dielectric layer 671 and the conductive layer 672 of the gate 67, and the plural dielectric layers 6711', 6721' and 6731' and the plural conductive layers 6712', 6722' and 6732' of the plural sub-gates 671', 672' and 673' are configured to define plural resistance adjustment regions 651', 652' and 653' and plural electric field adjustment regions 651, 652 and 653.

Figure 8E:
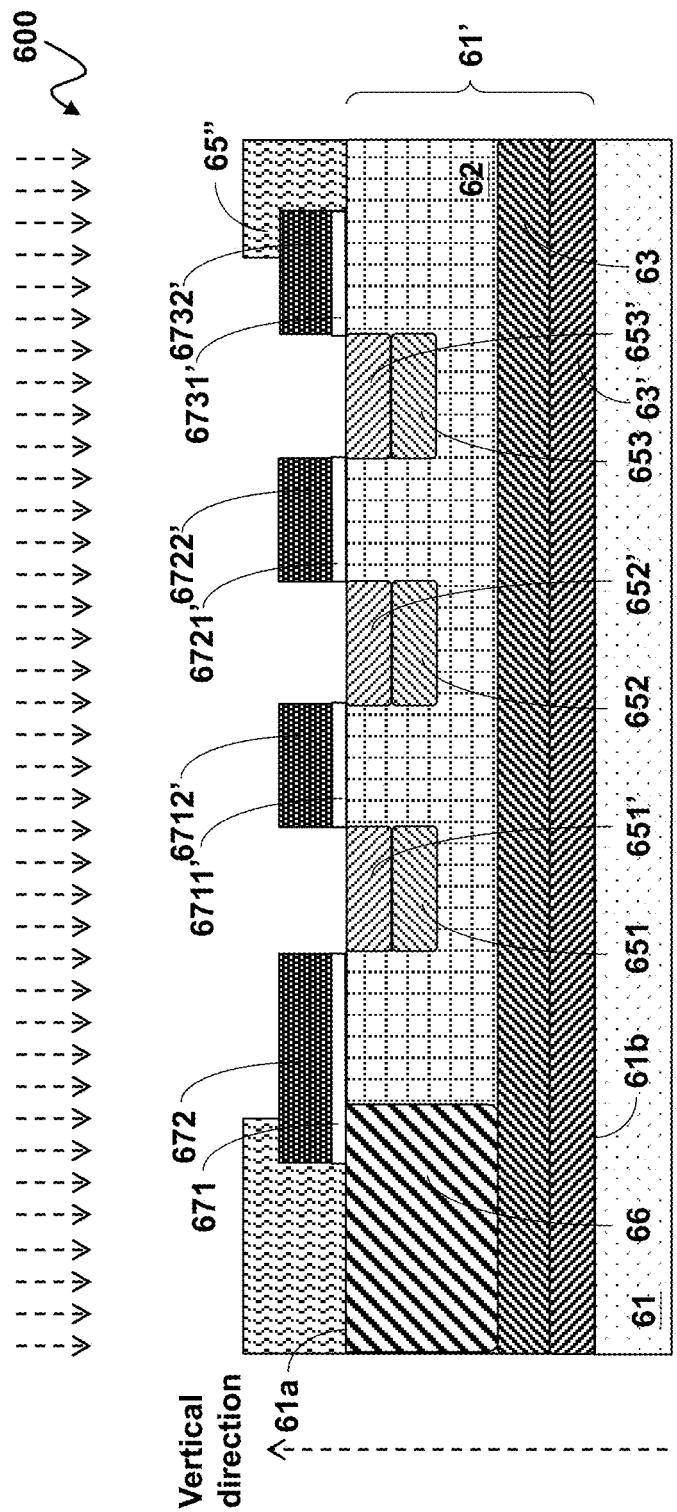

Then, please refer to FIG. 8E. The plural electric field adjustment regions 651, 652 and 653 and the plural resistance adjustment regions 651', 652' and 653' are formed. The plural electric field adjustment regions 651, 652 and 653 are formed beneath the top surface 61a and are not in contact with the top surface 61a. The plural electric field adjustment regions 651, 652 and 653 all have the second conductivity type. The plural electric field adjustment regions 651, 652 and 653 are located in the well region 62 in the semiconductor layer 61'. The plural resistance adjustment regions 651', 652' and 653' have the first conductivity type, and the plural resistance adjustment regions 651', 652' and 653' are all formed beneath and in contact with the top surface 61a. The plural resistance adjustment regions 651', 652' and 653' are in contact with the tops of the corresponding electric field adjustment regions 651, 652 and 653 in the well region 62 in the semiconductor layer 61', and the plural resistance adjustment regions 651', 652' and 653' are all formed between the body region 66 and the subsequently formed drain 69. The concentrations of the first conductivity type impurities in the plural resistance adjustment regions 651', 652' and 653' are all higher than the concentration of the first conductivity type impurities in the well region 62. The plural resistance adjustment regions 651', 652' and 653' serve to reduce the conduction resistance of the power device 600.

The plural electric field adjustment regions 651, 652 and 653 and the plural resistance adjustment regions 651', 652' and 653', for example, can be formed by using a photoresist layer 65'' formed by a lithography process step, the dielectric layer 671 and the conductive layer 672 of the gate 67, and the plural dielectric layers 6711', 6721' and 6731' and the plural conductive layers 6712', 6722' and 6732' of the plural sub-gates 671', 672' and 673' as a mask, and sequentially doping the second conductivity type impurities and the first conductivity type impurities into the well region 62 in the semiconductor layer 61', so as to form the plural electric field adjustment regions 651, 652 and 653 and the plural resistance adjustment regions 651', 652' and 653'. In the present embodiment, one same lithography process step can be used to form the photoresist layer 65'', and the photoresist layer 65'', the dielectric layer 671 and the conductive layer 672 of the gate 67, and the plural dielectric layers 6711', 6721' and 6731' and the plural conductive layers 6712', 6722' and 6732' of the plural sub-gates 671', 672' and 673' can serve as the mask for both the plural electric field adjustment regions 651, 652 and 653 and the plural resistance adjustment regions 651', 652' and 653', and then the second conductivity type impurities and the first conductivity type impurities can be implanted sequentially into the well region 62 in the form of accelerated ions in two ion implantation steps, so as to form the plural electric field adjustment regions 651, 652 and 653 and the plural resistance adjustment regions 651', 652' and 653'.

Subsequently, please refer to FIG. 8F. The spacer layer 673 of the gate 67 and the plural spacer layers 6713', 6723' and 6733' of the sub-gates 671', 672' and 673' are formed above the top surface 61a of the semiconductor layer 61'; and the source 68 and the drain 69 are formed. A portion of the body region 66 is located vertically beneath and in contact with the gate 67, to provide an inverse current channel of the power device 600 during ON operation. A portion of the well region 62 is located vertically beneath the gate 67, to provide a drift current channel of the power device 600 during ON operation.

The sub-gates 671', 672' and 673' are formed above the top surface 61a, and a portion of the well region 62 is located vertically beneath the sub-gates 671', 672' and 673'. The sub-gates 671', 672' and 673' and the gate 67 are plural separate independent structures which are not directly connected with one another. The source 68 and the drain 69 have the first conductivity type. The source 68 and the drain 69 are formed beneath the top surface 61a and in contact with the top surface 61a. The source 68 is located in the body region 66 under and outside of the gate 67, and the drain 69 is located in the well region 62 and away from the body region 66. From the top view, the sub-gates 671', 672' and 673' are located between the gate 67 and the drain 69.

There is a distance which is larger than 0 between the sub-gates 671', 672' and 673' and the gate 67 in the channel direction, and there is a distance which is larger than 0 between any two of the sub-gates 671', 672' and 673' in the channel direction. The sub-gates 671', 672' and 673' and the gate 67 may be formed by one same lithography process, one same deposition process and one same etching process.

Figure 8F:
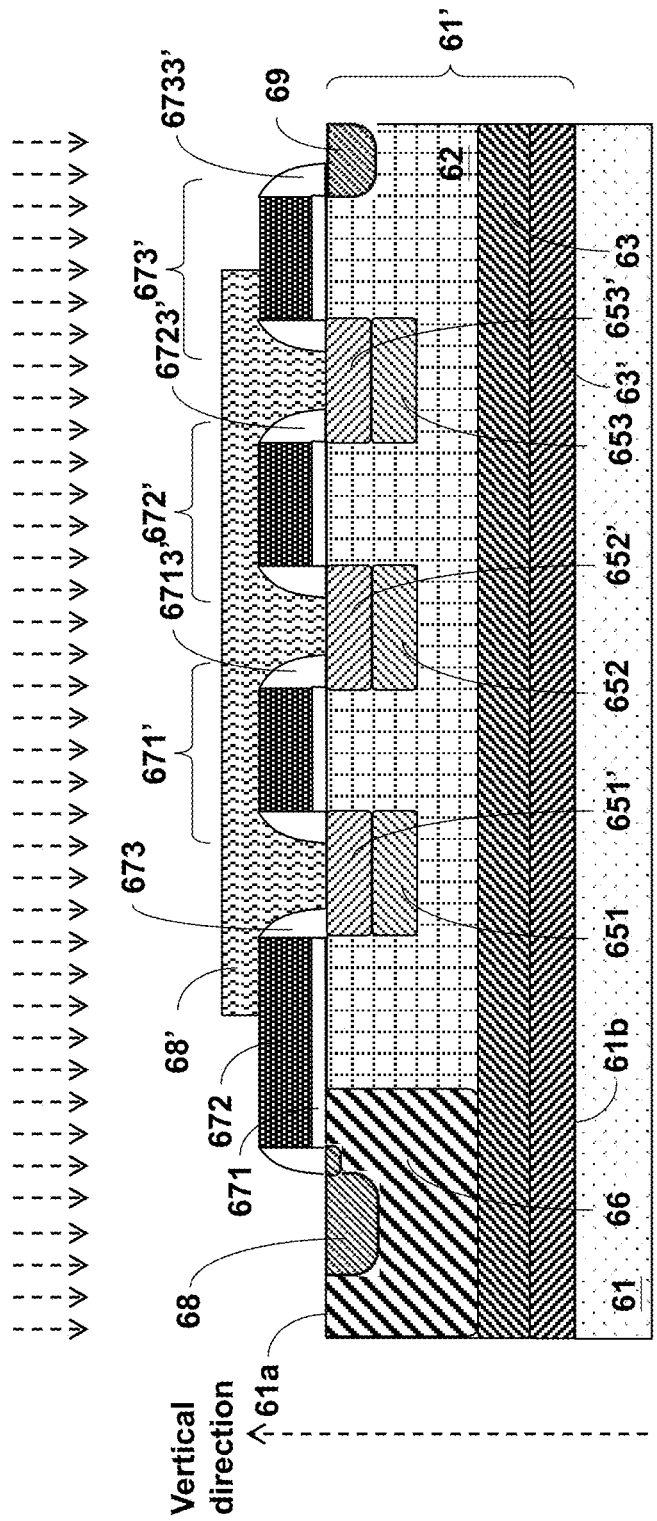

Please still refer to FIG. 8F. The source 68 and the drain 69 can be formed by, for example but not limited to, using the gate 67, the sub-gates 671', 672' and 673' and a photoresist layer 68' formed by a lithography process step as a mask, and doping the first conductivity type impurities into the body region 66 and the well region 62, so as to form the source 68 and the drain 69. In the present embodiment, the first conductivity type impurities can be implanted into the body region 66 and the well region 62 in the form of accelerated ions in an ion implantation process step, so as to form the source 68 and the drain 69.

Figure 8G:
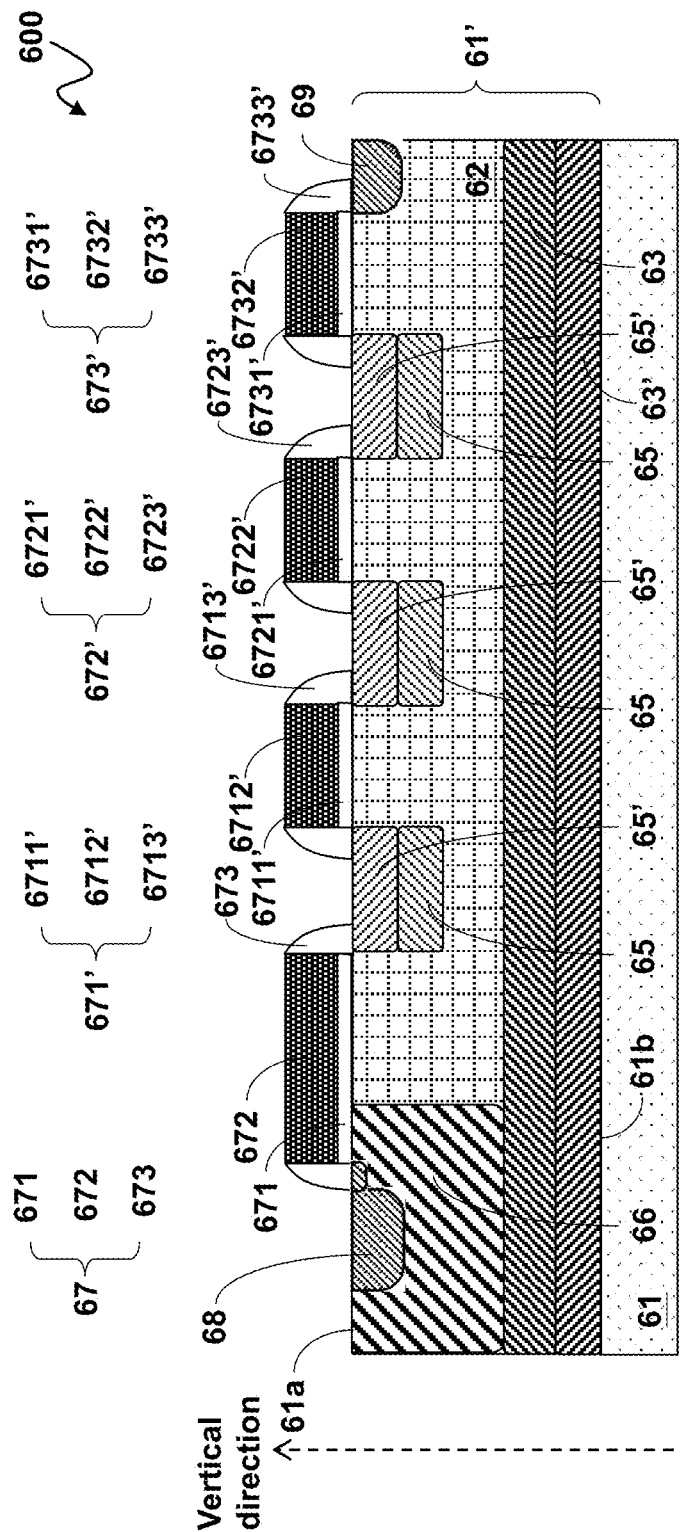

Subsequently, please refer to FIG. 8G. After the photoresist layer 68' is removed, the power device 600 is formed.

Figure 9A:
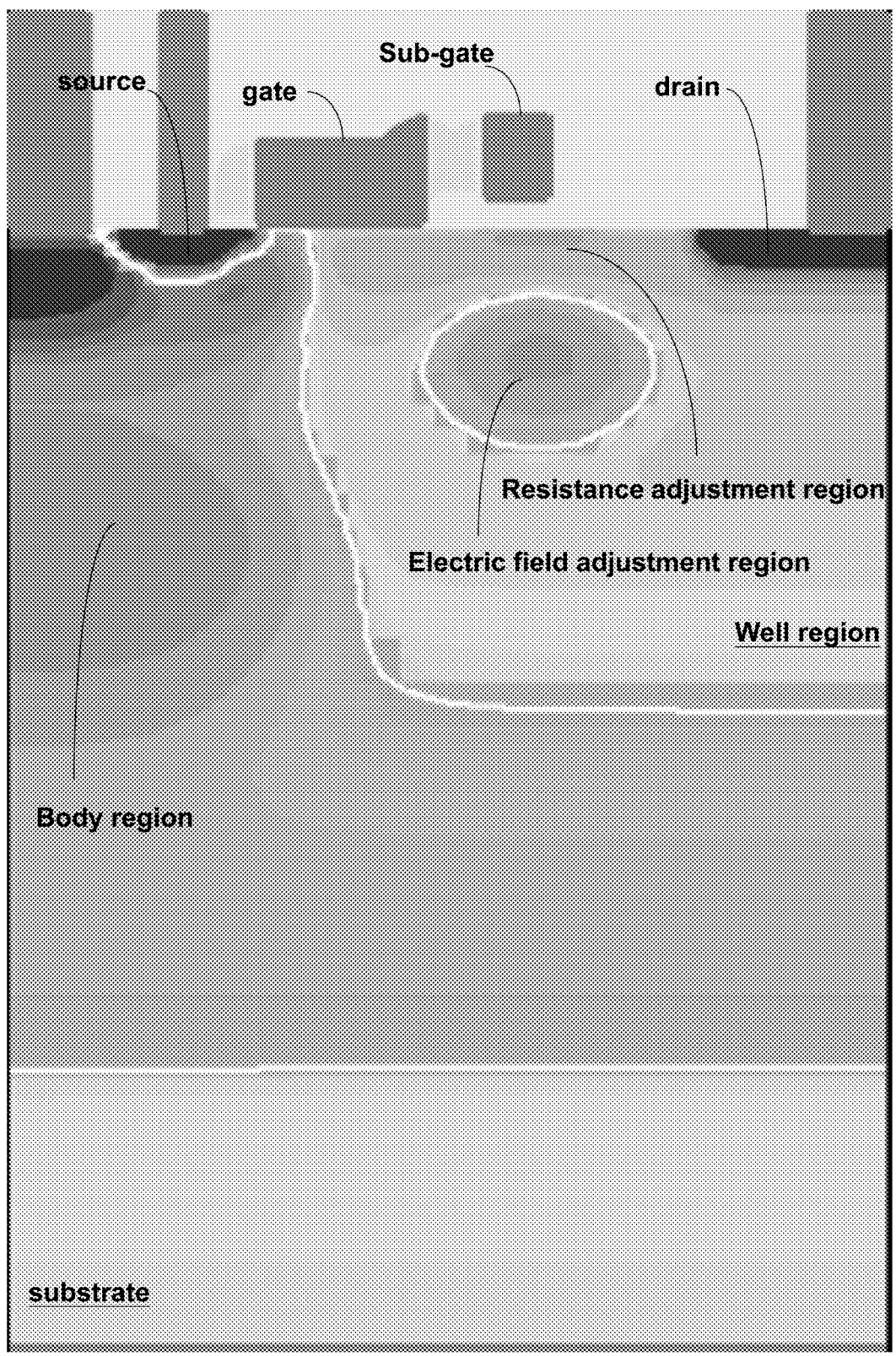
FIG. 9A shows a simulation result of a power device in accordance with the present invention by a cross-sectional view.

FIG. 9A shows a simulation result of a power device in accordance with the present invention by a cross-sectional view. FIG. 9A illustrates a simulation of how an actual power device is.

Figure 9B:
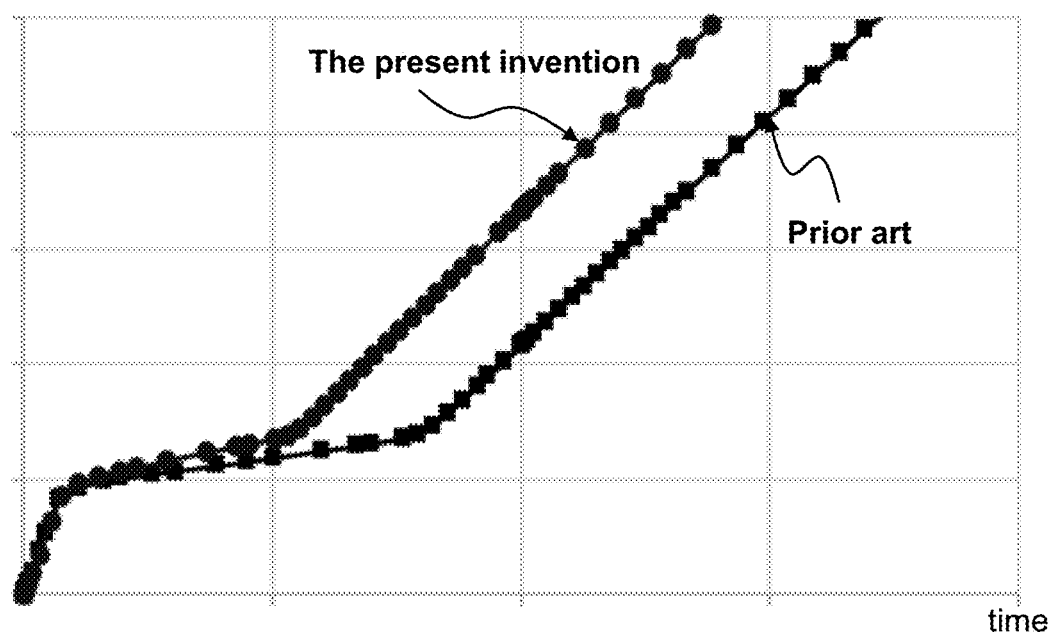
FIG. 9B shows an electrical diagram illustrating a gate-source voltage versus time in accordance with the power devices of the present invention and the prior art when switched into ON operations.

FIG. 9B shows an electrical diagram illustrating a gate-source voltage versus time in accordance with the power devices switched into an ON operation of the present invention and the prior art. Compared to the prior art, when the power device according to the present invention is switched to ON operation, a higher gate-source voltage can be achieved within a shorter response time. Therefore, the power device according to the present invention has a better transient response. As shown in FIG. 9B, the horizontal axis represents time while the longitudinal axis represents the gate to source voltage, wherein the power device 200 in the first embodiment is taken as an example. Compared to the prior art, the gate voltage of the power device according to the present invention increases with a higher speed during ON operation because the corresponding capacitance is reduced in comparison with the power device of the prior art, such that the gate voltage is raised to a target voltage within a relatively shorter time during ON operation. Thus, the transient response of the power device according to the present invention is improved.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures, such as a metal silicide layer, may be added. For another example, the lithography technique is not limited to the mask lithography technology but it can be electron beam lithography, etc. The various embodiments described above are not limited to being used alone; two embodiments may be used in combination, or a part of one embodiment may be used in another embodiment. One embodiment or one claim does not need to possess all the advantages of the present invention over the prior art. Therefore, the scope of the present invention should include all such variations, modifications and equivalents.

What is claimed is:

1. A power device, comprising:
   a semiconductor layer formed on a substrate, wherein the semiconductor layer has a top surface;
   a well region having a first conductivity type, wherein the well region is formed in the semiconductor layer and is located beneath the top surface and in contact with the top surface;
   a body region having a second conductivity type, wherein the body region is formed in the semiconductor layer and is located beneath the top surface and in contact with the top surface, wherein the body region is adjacent to the well region in a channel direction;
   a gate formed on the top substrate, wherein a portion of the body region is located vertically beneath the gate and in contact with the gate, to provide an inverse current channel of the power device during ON operation of the power device, and a portion of the well region is located vertically beneath the gate, to provide a drift current channel of the power device during the ON operation of the power device;
   a sub-gate formed above the top surface, wherein a portion of the well region is located vertically beneath the sub-gate, and wherein the sub-gate and the gate are not directly connected with each other;
   a source and a drain having the first conductivity type, wherein the source and the drain are formed beneath the top surface and in contact with the top surface, wherein the source is located in the body region under and outside of the gate, and the drain is located in the well region and away from the body region, wherein from a top view, the sub-gate is located between the gate and the drain; and
   an electric field adjustment region having the second conductivity type, wherein the electric field adjustment region is formed beneath the top surface and is not in contact with the top surface, wherein the electric field adjustment region is located in the well region in the semiconductor layer, and the electric field adjustment region is formed between the body region and the drain.

2. The power device of claim 1, further comprising a resistance adjustment region having the first conductivity type, wherein the resistance adjustment region is formed beneath the top surface and in contact with the top surface, wherein the resistance adjustment region is located above the electric field adjustment region in the well region in the semiconductor layer, and the resistance adjustment region is formed between the body region and the drain.

3. The power device of claim 2, wherein the electric field adjustment region is in contact with a bottom of the resistance adjustment region.

4. The power device of claim 2, wherein the resistance adjustment region and the electric field adjustment region are defined by a same lithography process step.

5. The power device of claim 2, further comprising a drift oxide region formed above the top surface, and under and in contact with the sub-gate, wherein at least a portion of the resistance adjustment region and the electric field adjustment region is located vertically beneath the drift oxide region.

6. The power device of claim 2, wherein the resistance adjustment region and the electric field adjustment region are completely not located vertically beneath the gate.

7. The power device of claim 2, wherein the resistance adjustment region and the electric field adjustment region are defined by the sub-gate.

8. The power device of claim 1, wherein the sub-gate is electrically floating or electrically connected to the source.

9. The power device of claim 1, further comprising:
a first deep well region having the second conductivity type, wherein the first deep well region is formed beneath the well region and the body region in the semiconductor layer, and in the semiconductor layer, the first deep well region is completely in contact with and covers bottoms of the well region and the body region; and
a second deep well region having the first conductivity type, wherein the second deep well region is formed beneath the first deep well region in the semiconductor layer, and in the semiconductor layer, the second deep well region is completely in contact with and covers a bottom of the first deep well region.

10. A manufacturing method of a power device, comprising:
forming a semiconductor layer on a substrate, wherein the semiconductor layer has a top surface;
forming a well region in the semiconductor layer, wherein the well region has a first conductivity type, and the well region is located beneath the top surface and in contact with the top surface;
forming a body region in the semiconductor layer, wherein the body region has a second conductivity type and the body region is located beneath the top surface and in contact with the top surface, wherein the body region is adjacent to the well region in a channel direction;
forming an electric field adjustment region beneath the top surface, wherein the electric field adjustment region is not in contact with the top surface, and the electric field adjustment region has the second conductivity type, wherein the electric field adjustment region is located in the well region in the semiconductor layer;
forming a gate on the top substrate, wherein a portion of the body region is located vertically beneath the gate and in contact with the gate, to provide an inverse current channel of the power device during ON operation of the power device, and a portion of the well region is located vertically beneath the gate, to provide a drift current channel of the power device during the ON operation of the power device;
forming a sub-gate above the top surface, wherein a portion of the well region is located vertically beneath the sub-gate, and the sub-gate and the gate are not directly connected with each other; and
forming a source and a drain beneath the top surface, wherein the source and the drain are in contact with the top surface, and the source and the drain have the first conductivity type, wherein the source is located in the body region under and outside of the gate, and the drain is located in the well region and away from the body region, wherein from a top view, the sub-gate is located between the gate and the drain;
wherein the electric field adjustment region is formed between the body region and the drain.

11. The manufacturing method of claim 10, further comprising: forming a resistance adjustment region beneath the top surface, wherein the resistance adjustment region is in contact with the top surface, and the resistance adjustment region has the first conductivity type, wherein the resistance adjustment region is located above the electric field adjustment region in the well region in the semiconductor layer, and the resistance adjustment region is formed between the body region and the drain.

12. The manufacturing method of claim 11, wherein the electric field adjustment region is in contact with a bottom of the resistance adjustment region.

13. The manufacturing method of claim 11, further comprising: forming a drift oxide region above the top surface, wherein the drift oxide region is under and in contact with the sub-gate, and at least a portion of the resistance adjustment region and the electric field adjustment region is located vertically beneath the drift oxide region.

14. The manufacturing method of claim 11, wherein the resistance adjustment region and the electric field adjustment region are completely not located vertically beneath the gate.

15. The manufacturing method of claim 11, wherein the resistance adjustment region and the electric field adjustment region are defined by the sub-gate.

16. The manufacturing method of claim 11, wherein a range of the resistance adjustment region and a range of the electric field adjustment region are defined by a same lithography process step.

17. The manufacturing method of claim 10, wherein the sub-gate is electrically floating or electrically connected to the source.

18. The manufacturing method of claim 10, further comprising:
forming a first deep well region beneath the well region and the body region in the semiconductor layer, wherein the first deep well region has the second conductivity type, and in the semiconductor layer, the first deep well region is completely in contact with and covers bottoms of the well region and the body region; and
forming a second deep well region beneath the first deep well region in the semiconductor layer, wherein the second deep well region has the first conductivity type, and in the semiconductor layer, the second deep well region is completely in contact with and covers a bottom of the first deep well region.

* * * * *